(12) United States Patent
Miyata et al.

(10) Patent No.: US 9,360,363 B2
(45) Date of Patent: Jun. 7, 2016

(54) PHOTOSENSOR INCLUDING SENSOR CIRCUIT ASSEMBLY WITH LIGHT EMITTER AND RECEIVER THAT FACE EACH OTHER

(71) Applicant: OMRON Corporation, Kyoto-shi, Kyoto (JP)

(72) Inventors: Tsuyoshi Miyata, Ayabe (JP); Jun Nakajima, Ayabe (JP); Seiji Miyashita, Fukuchiyama (JP); Kiyoshi Imai, Ayabe (JP); Kazuya Ohtsuki, Fukuchiyama (JP)

(73) Assignee: OMRON Corporation, Kyoto-shi (JP)

( * ) Notice: Subject to any disclaimer, the term of this patent is extended or adjusted under 35 U.S.C. 154(b) by 113 days.

(21) Appl. No.: 14/252,808

(22) Filed: Apr. 15, 2014

(65) Prior Publication Data

US 2014/0319319 A1    Oct. 30, 2014

(30) Foreign Application Priority Data

Apr. 24, 2013   (JP) ................................ 2013-091481

(51) Int. Cl.
| | |
|---|---|
| *H01L 31/167* | (2006.01) |
| *G01J 1/42* | (2006.01) |
| *H01L 31/02* | (2006.01) |
| *H01R 4/24* | (2006.01) |

(52) U.S. Cl.
CPC ............. *G01J 1/42* (2013.01); *H01L 31/02005* (2013.01); *H01L 31/167* (2013.01); *H01L 2924/0002* (2013.01); *H01R 4/2425* (2013.01)

(58) Field of Classification Search
CPC . H01R 4/2433; H01L 2924/00; H01L 31/167

USPC ................... 250/221, 551; 257/82, E11.108; 439/387, 389, 391, 395
See application file for complete search history.

(56) References Cited

U.S. PATENT DOCUMENTS

| | | | | |
|---|---|---|---|---|
| 4,972,089 A | * | 11/1990 | Stevenson | ............. H01L 31/167 250/216 |
| 5,076,801 A | * | 12/1991 | Schroll | ................ H01R 4/2441 439/404 |
| 6,602,089 B2 | * | 8/2003 | Abe | ..................... H01R 12/675 29/854 |

FOREIGN PATENT DOCUMENTS

| | | |
|---|---|---|
| JP | H11-121807 A | 4/1999 |
| JP | H11-145505 A | 5/1999 |

OTHER PUBLICATIONS

"Slot-type Photomicrosensor (Non-modulated) EE-SX47/67," Omron, copyright 2011.*

* cited by examiner

*Primary Examiner* — Renee D Chavez
(74) *Attorney, Agent, or Firm* — Mots Law, PLLC

(57) ABSTRACT

A photosensor is provided with a sensor circuit assembly. The sensor circuit assembly includes a light emitter, a light receiver, a light-emitter support, a light-receiver support, and a connecting part. The light emitter and the light receiver face each other. The light-emitter support extends from and supports the light emitter. The light-receiver support extends from and supports the light receiver. The connecting part connects one end of the light-emitter support with one end of the light-receiver support. The connecting part includes a seal and a connection terminal that protrudes from the seal. The connection terminal includes a first press-contact part, and a first pressure part that presses the first press-contact part in a press-contact direction.

18 Claims, 25 Drawing Sheets

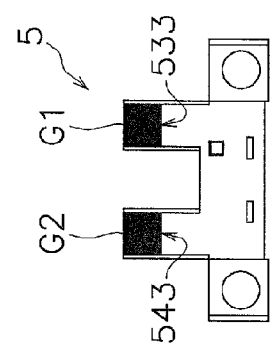
Fig.25A
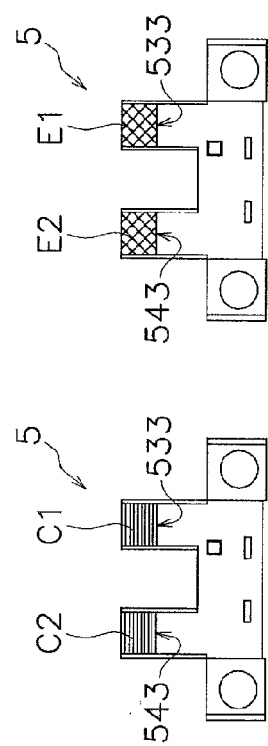
Fig.25C
Fig.25E
Fig.25G
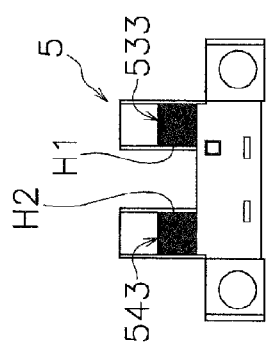
Fig.25B
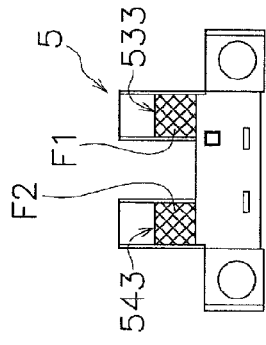
Fig.25D
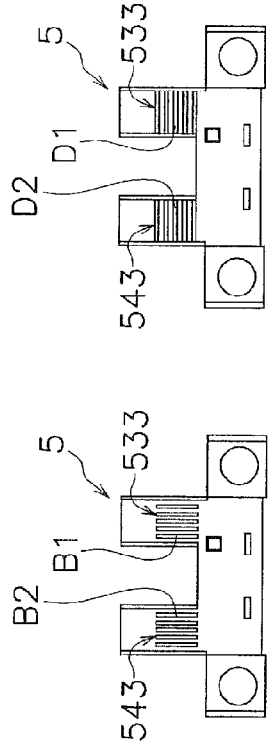
Fig.25F
Fig.25H

PHOTOSENSOR INCLUDING SENSOR CIRCUIT ASSEMBLY WITH LIGHT EMITTER AND RECEIVER THAT FACE EACH OTHER

CROSS REFERENCE TO RELATED APPLICATIONS

This application claims priority based on 35 USC 119 from prior Japanese Patent Application No. P2013-091481 filed on Apr. 24, 2013, entitled "PHOTOSENSOR", the entire contents of which are incorporated herein by reference.

BACKGROUND

1. Field of the Invention

The invention relates to photosensors.

2. Description of the Related Art

A photosensor is provided with a light emitting element, a light receiving element, and a seal part. For example, in the photosensor described in Japanese Unexamined Patent Publication No. 11-145505, the light emitting element and the light receiving element are connected via a lead frame, and one part of the lead frame is encapsulated in a seal part. Additionally, a connection terminal, which protrudes from the seal part, is also provided. A borehole through which the wire of a cable may be inserted is formed in the connection terminal; and the wire is secured to the connection terminal via soldering.

In the above described photosensor, a wire passes through the borehole of the connection terminal, and thereafter the connection terminal and the wire need to be soldered together. Therefore, there is the issue that there is an increase in the number of manufacturing workload.

Moreover, given that the connection terminal is integrated with the seal part, it is likely that heat will affect the seal part during soldering.

SUMMARY OF THE INVENTION

One aspect of the invention provides a highly reliable photosensor that may be manufactured using a reduced number of manufacturing man-hours.

A photosensor according to an embodiment comprises a sensor circuit assembly. The sensor circuit assembly includes a light emitter (light emitting element), a light receiver (light receiving element), a light-emitter support, a light-receiver support, and a connector (connecting part). The light emitting element and the light receiving element face each other. The light-emitter support extends from the light emitting element and supports the light emitting element. The light-receiver support extends from the light receiving element and supports the light receiving element. The connecting part connects one end of the light-emitter support with one end of the light-receiver support. The connecting part includes a seal (seal part) and a first terminal (first connection terminal) that protrudes from the seal part. The first connection terminal includes a first press-contact part, and a first pressure part configured to press the first press-contact part in a press-contact direction.

In the photosensor, the light-emitter support and the light-receiver support respectively support the light emitting element and the light receiving element, and are connected by the connecting part, which includes the seal part. Accordingly, the light emitting element, the light receiving element, and the seal part may be integrated within the sensor circuit assembly. Therefore, it is possible to install the light emitting element, the light receiving element, and the seal part, in a unified manner in another component. Additionally, the first connection terminal includes the first press-contact part, and therefore pressing the first connection terminal into contact with the wire connects the first connection terminal with the wire. Accordingly, there is no need for soldering when connecting the first connection terminal and the wire. Thus, the number of manufacturing man-hours decreases. Furthermore, given that soldering is no longer necessary, this curbs the effects of heat on the seal part. Thus, the reliability of the device improves. In this manner, a photosensor according to this aspect has increased reliability and uses a reduced number of manufacturing man-hours.

Moreover, the first connection terminal includes the first pressure part, and therefore the first connection terminal may be pressed into contact by pushing on the first pressure part. Accordingly, it is possible to reduce the load on the seal part compared to a case where the seal part needs to be pushed to make the press contact. Thus, the reliability of the device improves.

The first pressure part of the first connection terminal may be arranged outside a region on which the seal part projects in the press-contact direction. The seal part will not obstruct the first pressure part when the first pressure part is pressed. This facilitates press contact.

The first connection terminal may further include a joint (joining part). The joining part joins the first press-contact part and the seal part. The width of the joining part is smaller than the width of the first press-contact part. The first connection terminal is shaped curving downward from the joining part. In this instance, the first connection terminal may be bent with little force compared to the case where the width of the joining part and the width of the first press-contact part are the same. Therefore it is possible to reduce the amount of force applied to the seal part when bending the first connection terminal. This prevents the seal part from breaking during the bending process. Additionally, given that the first connection terminal may be bent with a small amount of force, this improves the precision of the bending angle for the first connection terminal.

The first pressure part of the first connection terminal may be one portion of an edge face of the first connection terminal as a sheet thickness of the first connection terminal. This facilitates formation of the first pressure part.

The photosensor may further include a first wire configured to connect to the sensor circuit assembly. The first press-contact part of the first connection terminal is pressed into contact with the first wire in the press-contact direction.

The first wire may include a core, and an inner coating that covers the core. The first press-contact part of the first connection terminal passes through the inner coating and cuts into the first wire to come in contact with the core. In this case, pushing the connection terminals onto the wire facilitates pressing the terminals into contact with the wire without first having to remove the inner coating of the wire before press contact.

The photosensor may further include a holder that supports the first wire. The holder includes a first wire housing, and a first terminal housing. The first wire housing houses the first wire. The first terminal housing houses the first connection terminal. The first wire is pressed into contact with the first connection terminal within the first wire housing. When the photosensor includes the holder, pushing the first connection terminal relative to the first wire housing, thereby facilitates pressing the first connection terminal into contact with the first wire.

The first press-contact part of the first connection terminal may include a slit. When the first press-contact part includes a slit, during press contact, the core of the first wire enters the slit, and the first connection terminal and the wire are electrically connected.

The first terminal housing may include a protrusion. The protrusion protrudes from a bottom of the first wire housing toward the slit. The bottom of the first terminal housing faces a tip end of the first connection terminal when the first terminal housing houses the first connection terminal. When the first terminal housing includes the protrusion, during press contact, the protrusion pushes the core of the first wire into the slit of the first connection terminal. Therefore, this prevents the core from escaping from the slit during press contact. Hereby, an accurate connection between the core and the first connection terminal may be established.

The holder may further include a catch that locks onto the sensor circuit assembly. The catch locks onto the sensor circuit assembly when the first connection terminal is pressed into contact with the first wire. When the holder further includes a catch, and the catch of the holder locks onto the sensor circuit assembly to maintain firm press contact between the first connection terminal and the first wire. Furthermore, during press contact, the catch is in the locked position with the sensor circuit assembly when the first connection terminal is arranged in the press-contact position with the first wire. Therefore, a worker may use the catch locking onto the sensor circuit assembly as a means of easily determining whether press contact of the first connection terminal is complete.

A second wire may be further provided to connect to the sensor circuit assembly. The connecting part further includes a second connection terminal that protrudes from the seal part. The second connection terminal is pressed into contact with the second wire in the press-contact direction. When the second wire and second connection terminal is further provided, the plurality of connection terminals may be pressed into contact simultaneously. Thus, the number of manufacturing man-hours decreases.

The second connection terminal may include a second press-contact part, and a second pressure part configured to be used to press the second press-contact part in a press-contact direction. The second connection terminal may be pressed into contact by pushing on the second pressure part in this case. Accordingly, each of the connection terminals may be accurately pressed into contact, compared to providing a common pressure part configured to be used to press the first connection terminal into contact, and to press the second connection terminal into contact.

The seal part may include a first side, and a second side. The first side is located on the opposite side of the second side. The first connection terminal and the second connection terminal may be provided on the first side. That is, no connection terminals are provided on the second side. Providing the first and second connection terminals on the first side and no connection terminals on the second side facilitates uniformly pressing the plurality of connection terminals into contact, compared to a case where the connection terminals are provided on both the first side, and the second side.

A holder that supports the first wire and the second wire may be further provided. The holder includes a first wire housing, a second wire housing, a first terminal housing, and a second terminal housing. The first wire housing houses the first wire. The second wire housing houses the second wire. The first terminal housing houses the first connection terminal. The second terminal housing houses the second connection terminal. The first wire housing and the second wire housing are mutually partitioned. The first wire is pressed into contact with the first connection terminal within the first wire housing. The second wire is pressed into contact with the second connection terminal within the second wire housing. Therefore in this case, the first wire and the second wire may be prevented from coming into contact with each other because the first wire housing, and the second wire housing are mutually partitioned.

The photosensor may further include a cable and a holder that supports the cable. The cable includes a first wire, a second wire, and an outer coating. The outer coating covers the first wire and the second wire. The holder includes a borehole that passes through the holder. An inner surface of the borehole is provided with at least three protrusions. The cable is arranged to pass through the borehole. An adhesive fills between the inner surface of the borehole and the cable. The protrusions establish a uniform gap between the inner surface of the borehole and the outer surface of the cable. Therefore, a uniform amount of adhesive may be poured in between the borehole and the cable when bonding the cable to the borehole. This improves the strength of the adhesive bonding of the cable.

The protrusions may be arranged at equal intervals in the circumferential direction of the borehole. This further establishes a more precisely uniform gap between the inner surface of the borehole and the outer surface of the cable.

The borehole may include a first bore section and a second bore section. The first bore section and the second bore section are arranged side by side along the axial direction of the borehole. The second bore section includes an end section of the borehole. The inner diameter of the second bore section is larger than the inner diameter of the first bore section. Given that the second bore section including the end section of the borehole has a large inner diameter, this facilitates pouring the adhesive between the borehole and the cable.

The holder may include a positioning section. The positioning section is arranged to overlap with one portion of the borehole in the direction the borehole passes through the holder. Including a positioning section in the holder facilitates positioning the end section of the cable when the cable is inserted into the borehole.

The holder may include a wall. The wall is arranged to overlap with one portion of the borehole. The wall includes a first wire housing, and the second wire housing. The first wire housing houses the first wire. The second wire housing houses the second wire. The positioning section is a portion of the wall. The wall, provided with wire housings, may also serve as the positioning section in this case.

The sensor circuit assembly may include a light-emitter lens part and a light-receiver lens part. The light-emitter lens part covers the light emitting element. The light-receiver lens part covers the light receiving element. The light-receiver lens part and the light-emitter lens part have mutually different shapes. When the sensor circuit assembly includes a light-emitter lens part and a light-receiver lens part, the shape of the light-emitter lens part and the shape of the light-receiver lens part may be a shape that is appropriate for the light emitting element and the light receiving element respectively.

The photosensor may further include a cable, a holder, and a main case. The cable includes a first wire. The holder supports the sensor circuit assembly and the cable. The main case includes an internal space that houses the sensor circuit assembly and the holder. With the press-contact direction being downward, and the opposite being upward, the holder includes a borehole that passes vertically through the holder. The cable is arranged to pass through the borehole. The holder includes a first wire housing, and a first terminal housing. The first wire housing houses the first wire. The first terminal housing houses the first connection terminal. The first wire housing extends in a direction intersecting with the vertical direction and opens upward. The first terminal housing is arranged intersecting with the first wire housing, and opens upward. The sensor circuit assembly is mounted onto the holder from above. A tip end of the first connection terminal is arranged facing downward. The first press-contact part of the first connection terminal pierces the first wire from above in the first wire housing and is thereby pressed into contact with the first wire. The internal space of the main case is opens downward. The main case is mounted onto the holder from above.

When assembling the photosensor, in this instance, the cable is inserted vertically into the borehole. Additionally, the sensor circuit assembly is mounted onto the holder from above, and thereby the first connection terminal is inserted into the first terminal housing. Hereby the first connection terminal is pressed into contact with the first wire inside the first wire housing. The main case is then mounted onto the holder from above, and thereby the sensor circuit assembly and the holder are housed in the internal space of the main case. Thus, the sensor circuit assembly and the main case may be assembled onto the holder in this manner in order from the top. This facilitates the assembling of the photosensor.

The photosensor may further include a holder and a main case. The holder supports the sensor circuit assembly. The main case houses the sensor circuit assembly and the holder. A light-emitter case, a light-receiver case, and a detection groove are included in the main case. The light-emitter case houses the light emitting element. The light-receiver case houses the light receiving element. The detection groove is located between the light-emitter case and the light-receiver case. The main case includes a mark. The mark indicates the detection depth required for an object to be detected in the detection groove. When there is a mark indicating the required detection depth, an operator may use the mark to easily determine the detection depth. Moreover, the detection depth signifies that stable detection will take place when an object to be detected is inserted at that depth or deeper than that depth.

The photosensor may further include a cable, a holder, and a main case. The cable includes a first wire and a second wire. The holder supports the sensor circuit assembly and the cable. The main case includes an internal space that houses the sensor circuit assembly and the holder. With the press-contact direction being downward, and the opposite being upward, the holder includes a borehole that passes vertically through the holder. The cable is arranged to pass through the borehole. The holder includes a first wire housing, a second wire housing, a first terminal housing, and a second terminal housing. The first wire housing houses the first wire. The second wire housing houses the second wire. The first terminal housing houses the first connection terminal. The second terminal housing houses the second connection terminal. The first wire housing and the second wire housing extend in a direction intersecting the vertical direction and open upward. The first terminal housing is arranged intersecting with the first wire housing, and opens upward. The second terminal housing is arranged intersecting with the second wire housing, and opens upward. A tip end of the first connection terminal and the tip end of the second connection terminal are arranged facing downward. The first connection terminal is pressed into contact with the first wire within the first wire housing. The second connection terminal is pressed into contact with the second wire within the second wire housing.

In this case the sensor circuit assembly is mounted onto the holder from above, and thereby the first connection terminal is inserted into the first terminal housing, and the second connection terminal is inserted into the second terminal housing. Hereby the first connection terminal is pressed into contact with the first wire inside the first wire housing, and the second connection terminal is pressed into contact with the second wire inside the second wire housing. When the sensor circuit assembly is mounted onto the holder in this manner, the first connection terminal is pressed into contact at the same time the second connection terminal is pressed into contact. This facilitates the assembling of the photosensor.

BRIEF DESCRIPTION OF THE DRAWINGS

FIGS. 25A-25H illustrate a detection depth mark in accordance with another embodiment.

DETAILED DESCRIPTION OF THE PREFERRED EMBODIMENTS

Figure 1:
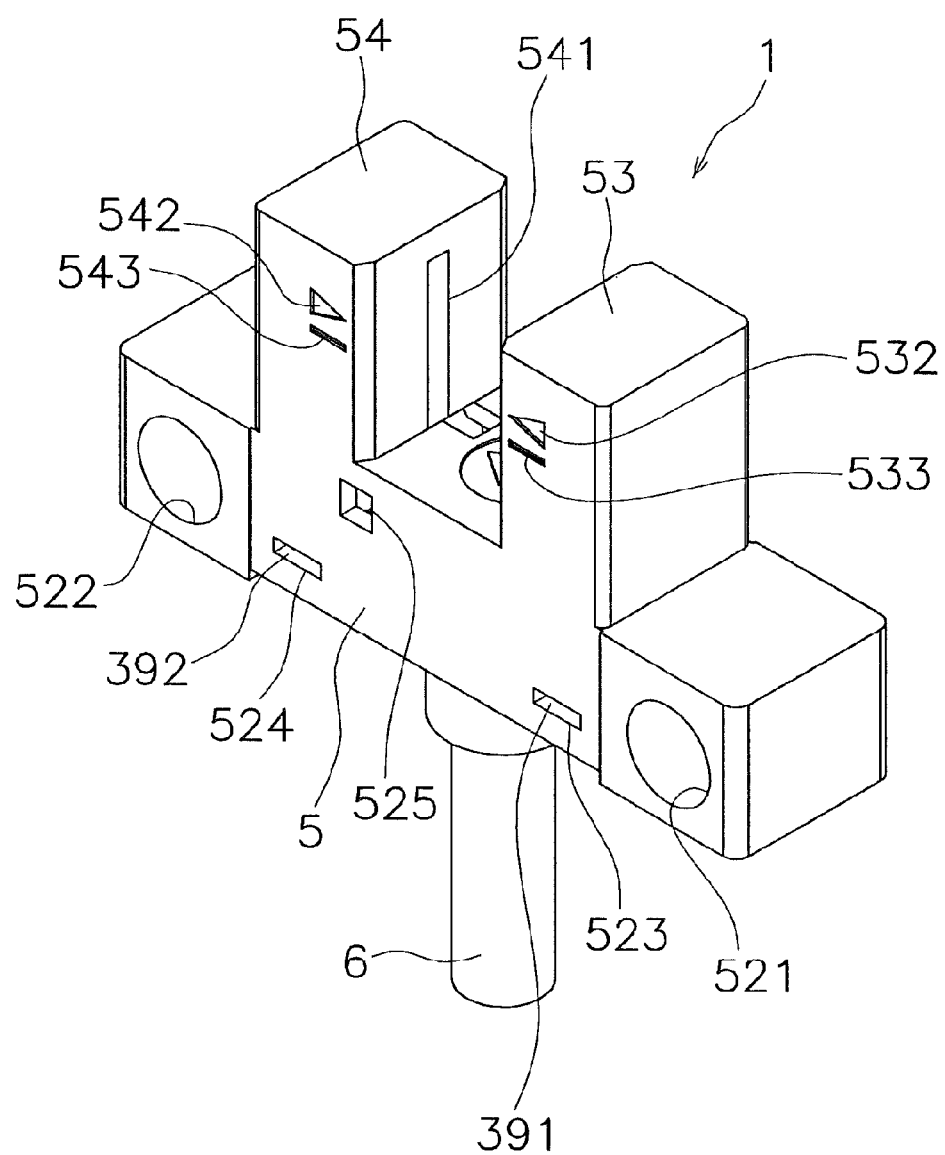
FIG. 1 is a perspective view of a photosensor.
Figure 2:
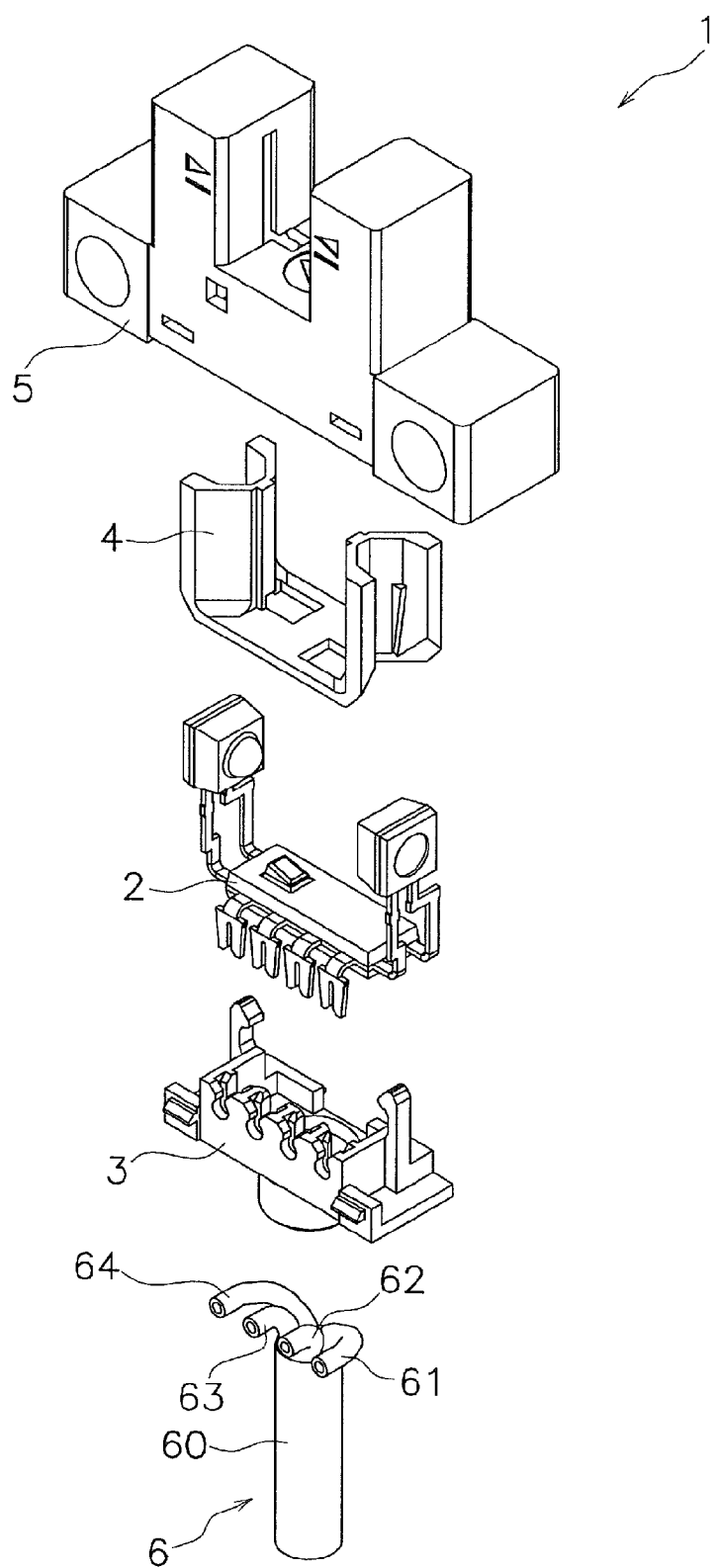
FIG. 2 is an exploded perspective view of the photosensor.

Embodiments of photosensors are described below with reference to the drawings. FIG. 1 is a perspective view of photosensor 1. FIG. 2 is an exploded perspective view of photosensor 1. As illustrated in FIG. 2, photosensor 1 includes sensor circuit assembly 2, holder 3, sub case 4, main case 5, and cable 6.

Figure 3:
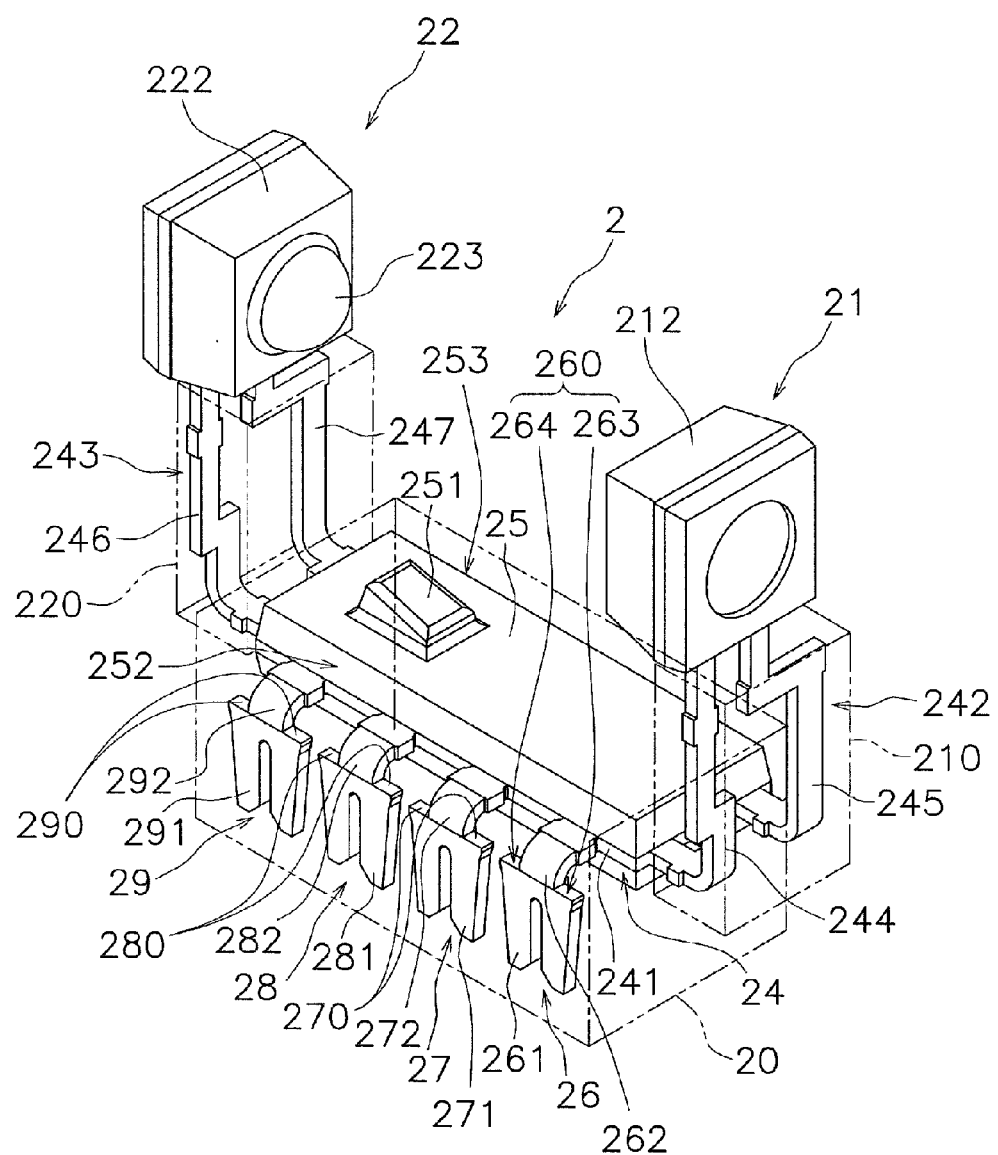
FIG. 3 is a perspective view of the sensor body.
Figure 4:
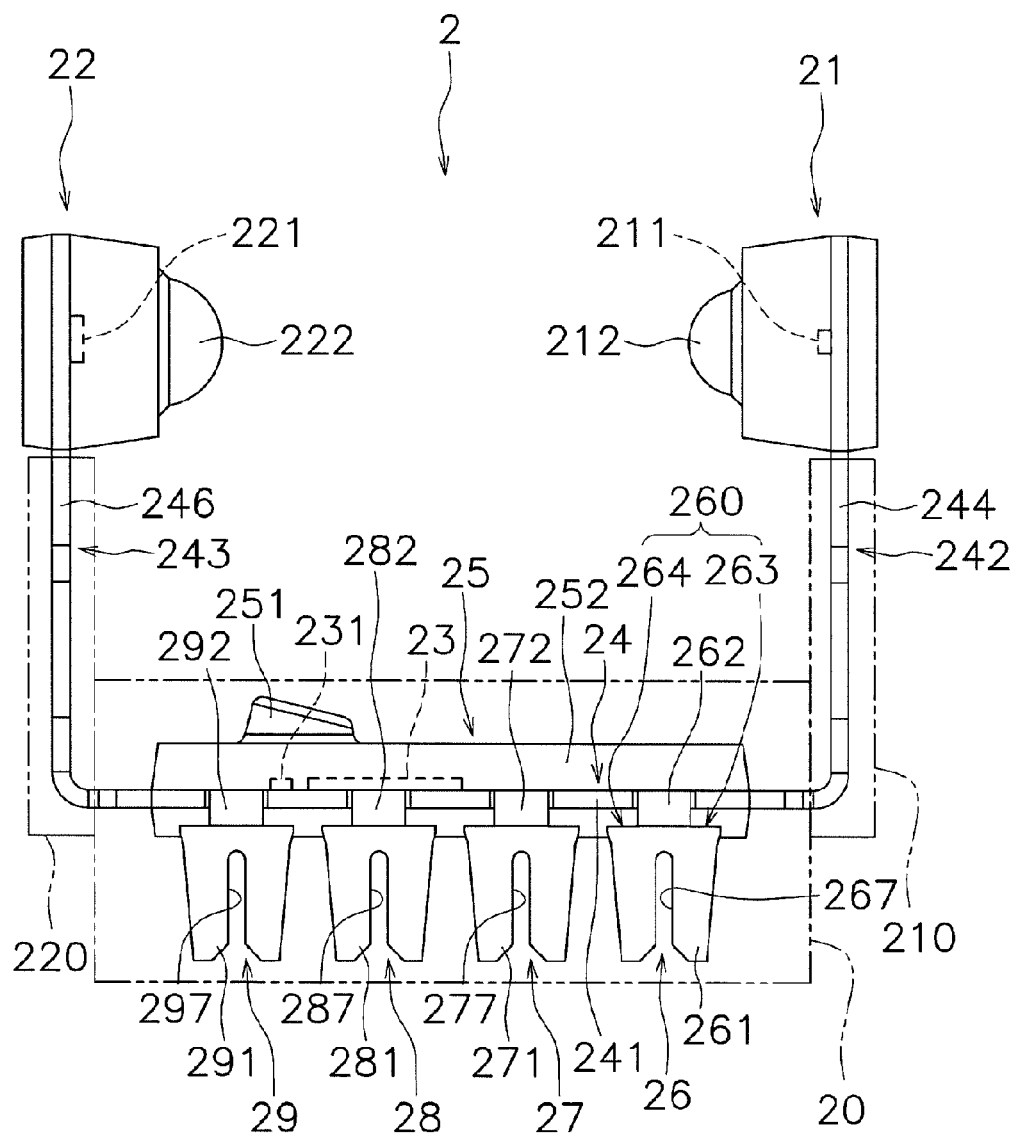
FIG. 4 is a front view of the sensor body.
Figure 5:
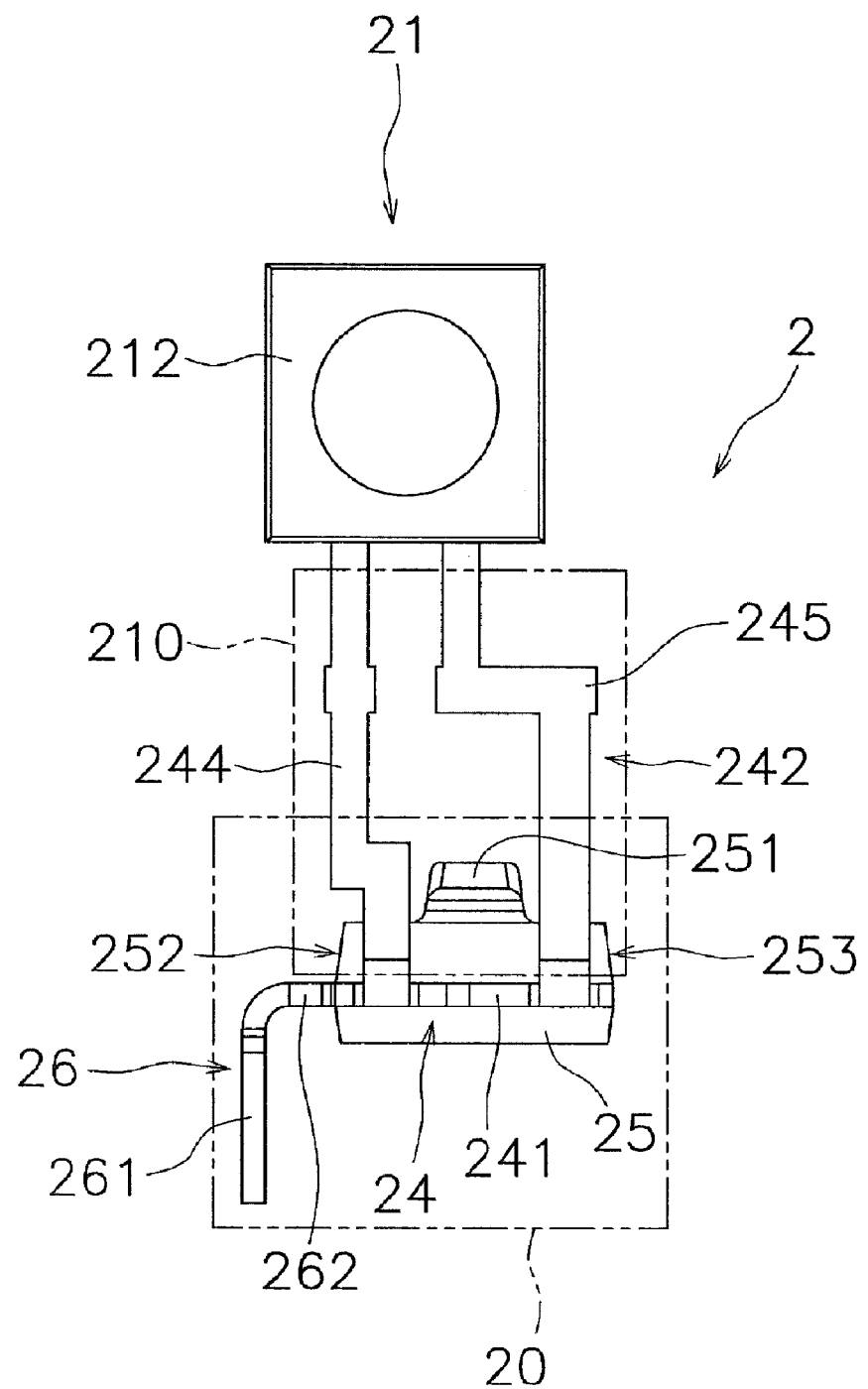
FIG. 5 is a side view of the sensor body.

FIG. 3 is a perspective view of sensor circuit assembly 2. FIG. 4 is a front view of sensor circuit assembly 2. FIG. 5 is a side view of sensor circuit assembly 2.

As illustrated in FIG. 3 to FIG. 5 sensor circuit assembly 2 includes light emitter part 21, light receiver part 22, and connecting part 20. Light emitter part 21, light receiver part 22, and connecting part 20 are all integrated.

In the present embodiment, a press-contact direction (later described) is referred to as "downward". The direction opposite the press-contact direction is referred to as "upward". The direction intersecting the press-contact direction, which is the direction along which light emitter part 21 and light receiver part 22 are lined up, is referred to as the "left and right direction". The direction in which light emitter part 21 and light receiver part 22 are lined up, and which intersects with the press-contact direction is referred to as "front and rear direction".

As illustrated in FIG. 4, light emitter part 21 includes light emitting element 211, light-emitter lens part 212, and light-emitter support 210. Light emitting element 211 may be, for example, a light emitting diode. However, a different element besides a light emitting diode may be used as light emitting element 211. Light emitting element 211 is mounted on lead frame 24 (later described). Light-emitter lens part 212 covers light emitting element 211. Light-emitter lens part 212 is circular when viewed from the light emission direction. Light-emitter lens part 212 may be formed from a translucent material. Light-emitter lens part 212 may be made from resin, for example. Light-emitter support 210 supports light emitting element 211. Light-emitter support 210 extends upward from connecting part 20. Light-emitter support 210 includes light-emitter leads 242.

Light receiver part 22 is arranged separate from light emitter part 21 in the left and right direction. Light receiver part 22 includes light receiving element 221, light-receiver lens part 222, and light-receiver support 220. Light receiving element 221 may be, for example, a phototransistor. However, a different element besides a phototransistor may be used as light receiving element 221. Light receiving element 221 is mounted on lead frame 24. Light receiving element 221, and light emitting element 211 are arranged facing each other. In other words, photosensor 1 according to the present embodiment is a so-called transmissive photosensor. Light-receiver support 220 supports light receiving element 221. Light-receiver support 220 extends upward from connecting part 20. Light-receiver support 220 includes light-receiver leads 243.

Light-receiver lens part 222 covers light receiving element 221. Light-receiver lens part 222 is circular when viewed from the light receiving direction. Light-receiver lens part 222 and light-emitter lens part 212 are arranged facing each other. The shape of light-receiver lens part 222 differs from the shape of light-emitter lens part 212. More specifically, the area of light-receiver lens part 222 differs from the area of light-emitter lens part 212. In other words, the diameter of light-receiver lens part 222 differs from the diameter of light-emitter lens part 212. The diameter of light-receiver lens part 222 is larger than the diameter of light-emitter lens part 212. Light-receiver lens part 222 may be formed from a translucent material. Light-receiver lens part 222 may be made from resin, for example. Light-receiver lens part 222 may be made from the same material as light-emitter lens part 212.

Connecting part 20 connects one end of light-emitter support 210 with one end of light-receiver support 220. Connecting part 20 includes circuit 23, seal part 25, main leads 241, and a plurality of connection terminals 26-29.

Circuit 23 is electrically connected to light emitting element 211, and light receiving element 221 via lead frame 24. Circuit 23 is an electronic circuit that controls light receiving element 221 and light emitting element 211. Circuit 23 is mounted on lead frame 24. For example, circuit 23 may be mounted to lead frame 24 via a mounting method such as wire bonding. Circuit 23 includes, for example, an IC chip. Circuit 23 controls the emission of light from light emitting element 211. Circuit 23 also determines whether or not light is received at light receiving element 221, and controls the output signal on the basis of the determined result. Sensor circuit assembly 2 includes an operation indicator 231. Circuit 23 controls operation indicator 231 on the basis of the result of determining whether or not light was received. Operation indicator 231 is, for example, a light emitting element such as a light emitting diode, and is mounted on lead frame 24.

Lead frame 24 includes the above described main leads 241, light-emitter leads 242, and light-receiver leads 243. Main leads 241 are flat in directions extending parallel to the left and right direction and the front and rear direction. Main leads 241 are located between light-emitter leads 242 and light-receiver leads 243 in the left and right direction. Above described circuit 23 is mounted on main leads 241. Above described operation indicator 231 is also mounted on main leads 241.

Light-emitter leads 242 connect light emitting element 211 and main leads 241. Light emitting element 211 is mounted on light-emitter leads 242. Light-emitter leads 242 protrude rightward out from main leads 241. Light-emitter leads 242 are shaped curving upward. As illustrated in FIG. 3, light-emitter leads 242 include first light-emitter lead 244 and second light-emitter lead 245. First light-emitter lead 244 and second light-emitter lead 245 are arranged separated from each other in the front and rear direction. First light-emitter lead 244 and second light-emitter lead 245 have mutually different shapes.

Light-receiver leads 243 connect light receiving element 221 and main leads 241. Light receiving element 221 is mounted on light-receiver leads 243. Light-receiver leads 243 mirrors the shape of light-emitter leads 242 with respect to a plane that is perpendicular to the left and right direction. Light-receiver leads 243 protrude leftward out from main leads 241. Light-receiver leads 243 are shaped curving upward. Light-receiver leads 243 include first light-receiver lead 246, and second light-receiver lead 247. First light-receiver lead 246 and second light-receiver lead 247 are arranged separated from each other in the front and rear direction. First light-receiver lead 246 and second light-receiver lead 247 have mutually different shapes. First light-emitter lead 244 and first light-receiver lead 246 mirror each other with respect to a plane perpendicular to the left and right direction. Second light-emitter lead 245 and second light-receiver lead 247 mirror each other with respect to a plane perpendicular to the left and right direction.

Seal part 25 seals circuit 23 on lead frame 24. Seal part 25 seals circuit 23 and one portion of lead frame 24. More specifically, seal part 25 seals circuit 23 on main leads 241. Seal part 25 also seals operation indicator 231 on main leads 241. Seal part 25 may be formed from a translucent material. Seal part 25 may be made from resin, for example. Seal part 25 has projection 251 that protrudes upward. Projection 251 is arranged facing operation indicator 231. Seal part 25 may be made from the same material as light-emitter lens part 212 and light-receiver lens part 222.

The plurality of connection terminals 26-29, protruding from seal part 25, is arranged horizontally side by side. Seal part 25 includes first side 252 and second side 253. First side 252 is the front surface of seal part 25. Second side 253 is located on the opposite side of first side 252. In other words, second side 253 is the rear surface of seal part 25. Of first side 252 and second side 253, the plurality of connection terminals 26-29 is provided on only first side 252. That is, no connection terminals are provided on second side 253. The tip ends of the plurality of connection terminals 26-29 are arranged facing downward. As will be later described, the plurality of connection terminals 26-29 is respectively pressed into contact with a plurality of wires 61-64.

The plurality of connection terminals 26-29 includes first connection terminal 26, second connection terminal 27, third connection terminal 28, and fourth connection terminal 29. First connection terminal 26 and fourth connection terminal 29 are arranged separated from each other in the left and right direction. Second connection terminal 27 and third connection terminal 28 are arranged between first connection terminal 26 and fourth connection terminal 29. First connection terminal 26 and fourth connection terminal 29 are power supply terminals for supplying circuit 23 with power. Second connection terminal 27 and third connection terminal 28 are output terminals for outputting the output signal from circuit 23.

First connection terminal 26 includes first press-contact part 261 and first joining part 262. First joining part 262 joins first press-contact part 261 and seal part 25. First joining part 262 is integrally connected with lead frame 24. The width of first joining part 262 is smaller than the width of first press-contact part 261. First connection terminal 26 is shaped bending downward from first joining part 262.

As illustrated in FIG. 3 and FIG. 4, first connection terminal 26 includes first pressure part 260. First pressure part 260 is a portion for pressing first press-contact part 261 in the press-contact direction. That is, first pressure part 260 is for pressing first press-contact part 261 downward. First pressure part 260 is one portion of the edge face (the face formed from the thickness of a sheet like member) of the first connection terminal as a sheet thickness of first connection terminal 26. First pressure part 260 is arranged outside a region on which seal part 25 projects in the press-contact direction. In other words, first pressure part 260 does not overlap seal part 25 when viewed from the press-contact direction. First pressure part 260 includes first tiered-part 263 and second tiered-part 264. First tiered-part 263 and second tiered-part 264 are arranged contiguously with first joining part 262. First joining part 262 is connected with first press-contact part 261 between first tiered-part 263 and second tiered-part 264. First tiered-part 263 and second tiered-part 264 are flat shapes that extend in the left and right direction.

Figure 6:
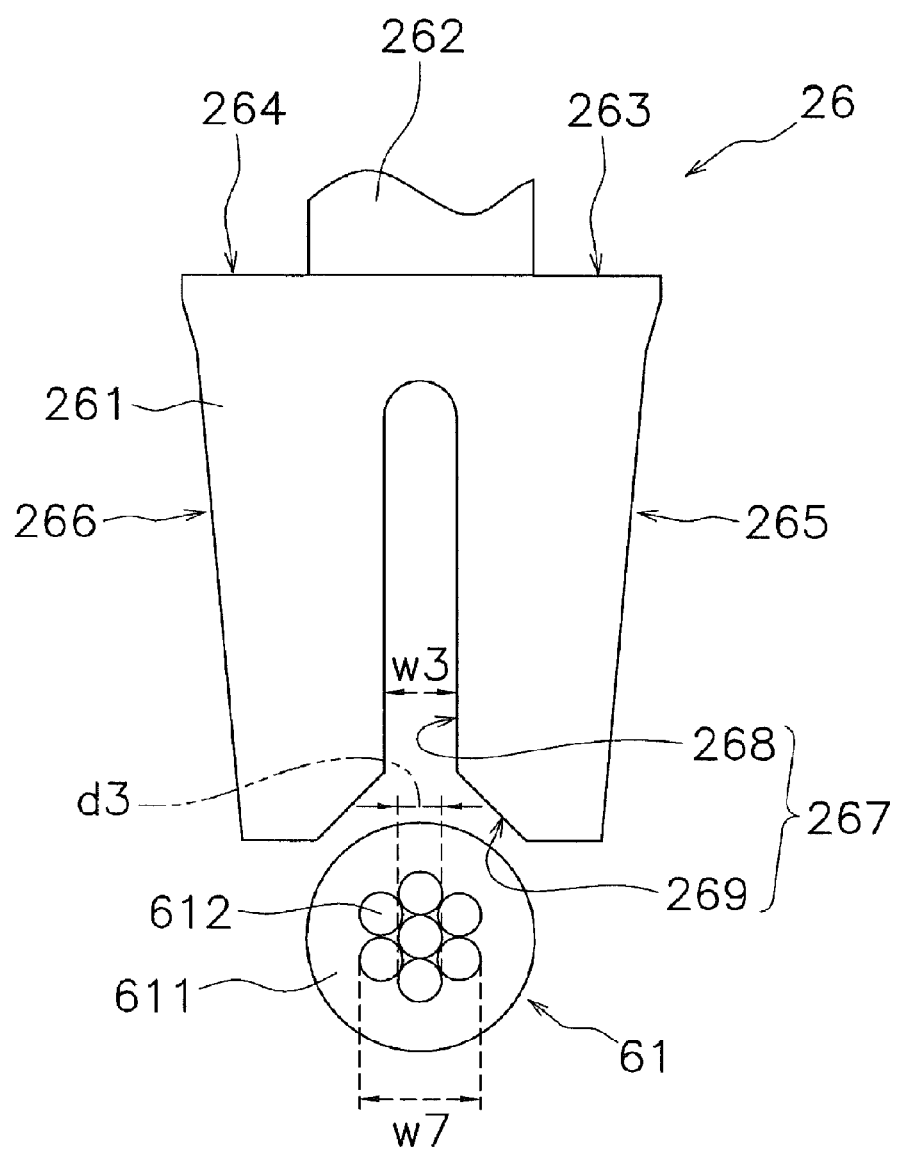
FIG. 6 is an enlarged view of a first connection terminal.

FIG. 6 is an enlarged view of first press-contact part 261. First press-contact part 261 tapers downward. More specifically, first press-contact part 261 includes first-side end part 265 and second-side end part 266. First-side end part 265 is the right-side end of first press-contact part 261. Second-side end part 266 is located on the opposite side of first-side end part 265. In other words, second-side end part 266 is the left-side end of first press-contact part 261. The distance between first-side end part 265 and second-side end part 266 decreases toward the lower portion of first-side end part 265 and second-side end part 266.

The tip end of first connection terminal 26 includes slit 267. That is, first press-contact part 261 includes slit 267. Slit 267 extends from the tip end toward the upper portion of first connection terminal 26. Slit 267 includes linear part 268 and expanded part 269. Expanded part 269 is located below linear part 268. Expanded part 269 is provided at the entrance to slit 267. The width of slit 267 widens toward the lower portion of expanded part 269. Linear part 268 has a linear shape and extends upward from expanded part 269.

Second connection terminal 27, third connection terminal 28, and fourth connection terminal 29 are all structured in the same manner as first connection terminal 26. More specifically, second connection terminal 27 includes second press-contact part 271 and second joining part 272. Third connection terminal 28 includes third press-contact part 281 and third joining part 282. Fourth connection terminal 29 includes fourth press-contact part 291 and fourth joining part 292. Second press-contact part 271, third press-contact part 281, and fourth press-contact part 291 are all structured in the same manner as first press-contact part 261, therefore a description thereof will be omitted. Second joining part 272, third joining part 282, and fourth joining part 292 are all structured in the same manner as first joining part 262, therefore a description thereof will be omitted. Additionally, as illustrated in FIG. 3, second connection terminal 27 includes second pressure part 270. Third connection terminal 28 includes third pressure part 280. Fourth connection terminal 29 includes fourth pressure part 290. Second pressure part 270, third pressure part 280, and fourth pressure part 290 are all structured in the same manner as first pressure part 260, therefore a description thereof will be omitted.

Figure 7:
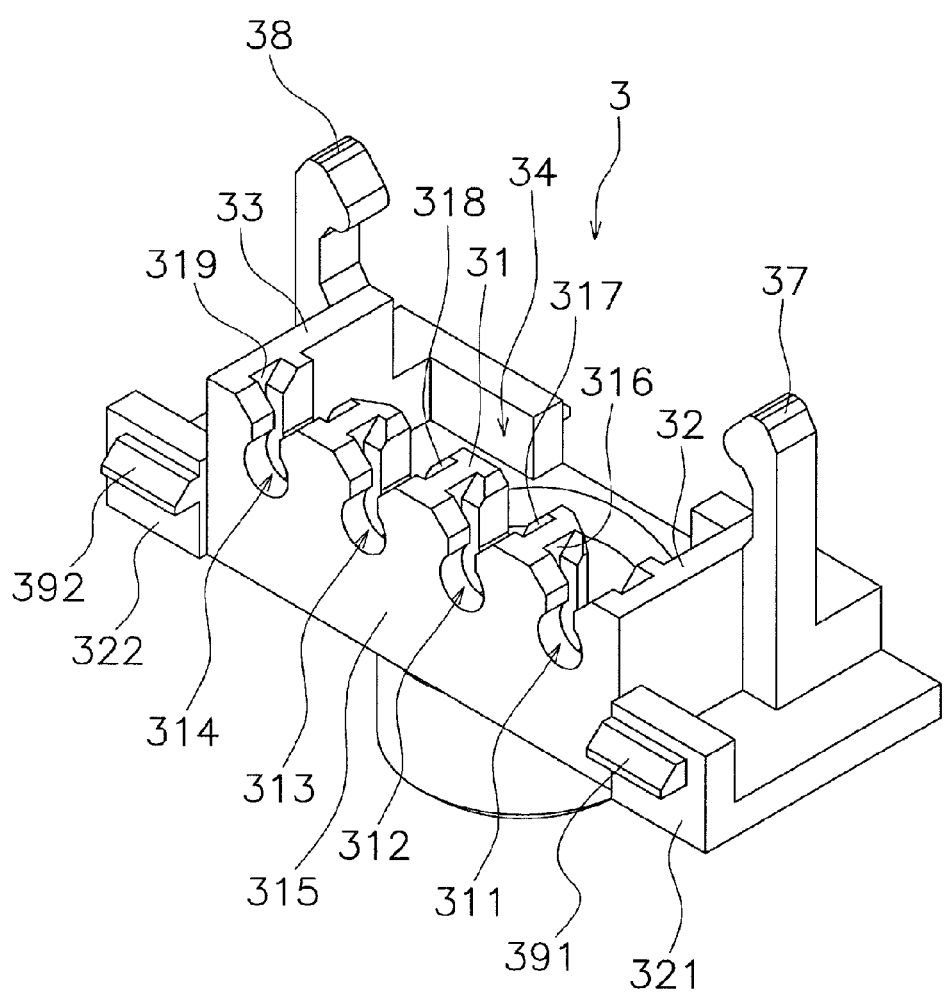
FIG. 7 is a perspective view of a holder.
Figure 8:
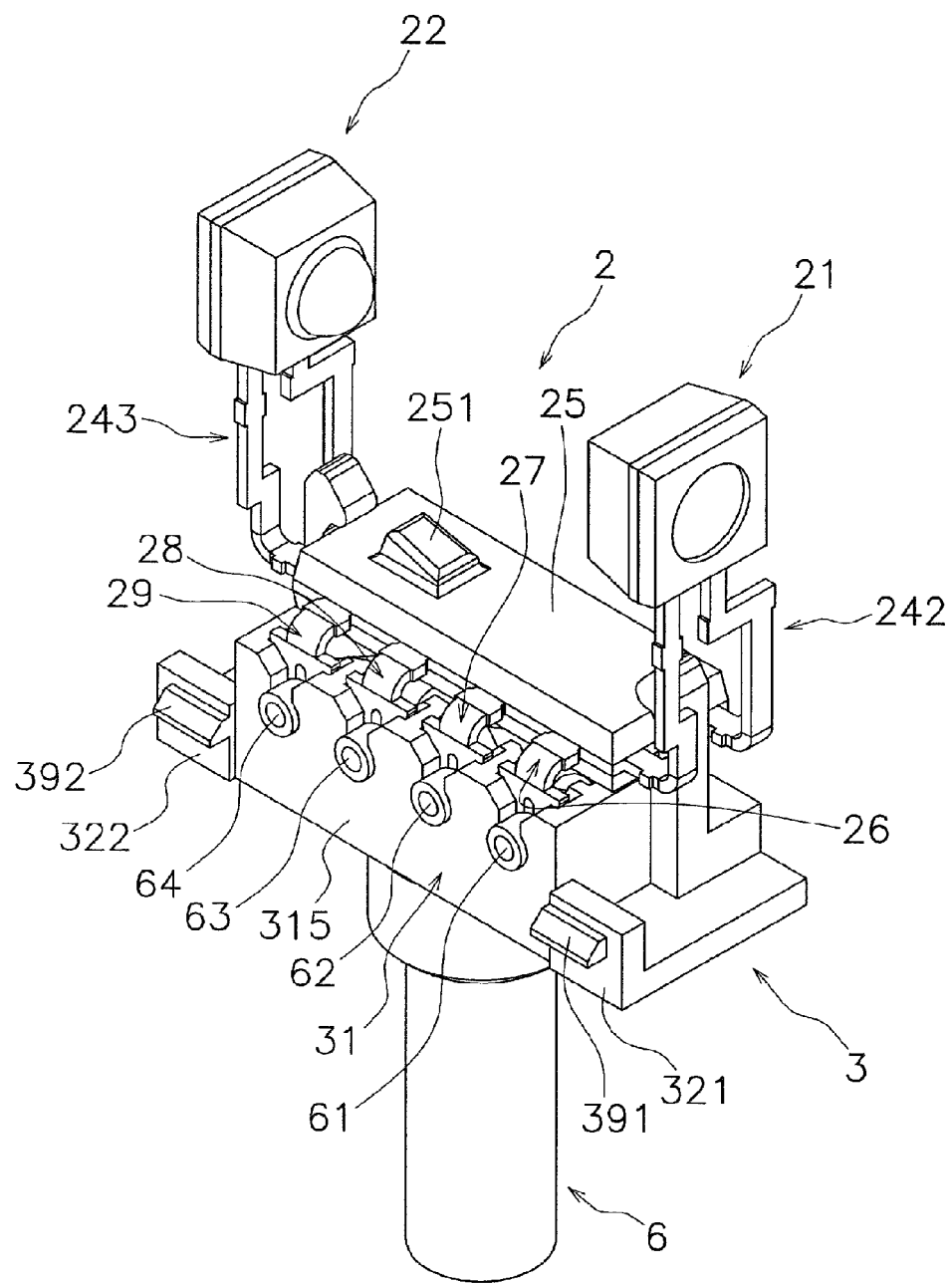
FIG. 8 is a perspective view illustrating the holder, the sensor body, and the cable.

FIG. 7 is a perspective view of holder 3. FIG. 8 is a perspective view illustrating holder 3, sensor circuit assembly 2, and cable 6. As illustrated in FIG. 8, cable 6 includes a plurality of wires 61-64. More specifically, cable 6 includes first wire 61, second wire 62, third wire 63, and fourth wire 64. Holder 3 supports sensor circuit assembly 2 and the plurality of wires 61-64.

Holder 3 includes first wall 31. As illustrated in FIG. 7 first wall 31 includes a plurality of wire housings 311-314. The plurality of wire housings 311-314 respectively houses the plurality of wires 61-64. The plurality of wire housings 311-314 passes through first wall 31 in the front and rear direction. The plurality of wire housings 311-314 opens upward.

As illustrated in FIG. 2, cable 6 includes outer coating 60. Outer coating 60 covers the plurality of wires 61-64. Outer coating 60 is removed from the end part of cable 6, exposing the plurality of wires 61-64. The plurality of wire housings 311-314 supports the plurality of wires 61-64 exposed from outer coating 60.

As illustrated in FIG. 7, first wall 31 includes first wire housing 311, second wire housing 312, third wire housing 313, and fourth wire housing 314. First to fourth wire housings 311-314 are mutually partitioned and arranged in the left and right direction side by side. First wire housing 311 houses first wire 61. Second wire housing 312 houses second wire 62. Third wire housing 313 houses third wire 63. Fourth wire housing 314 houses fourth wire 64.

Figure 9:
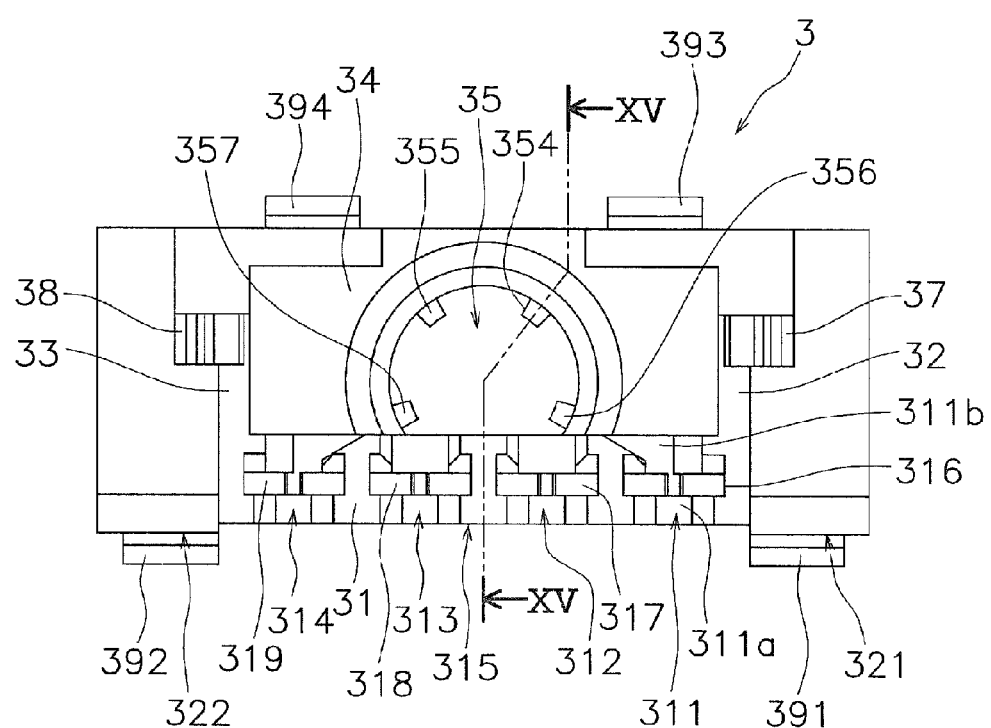
FIG. 9 is a top view of the holder.
Figure 10:
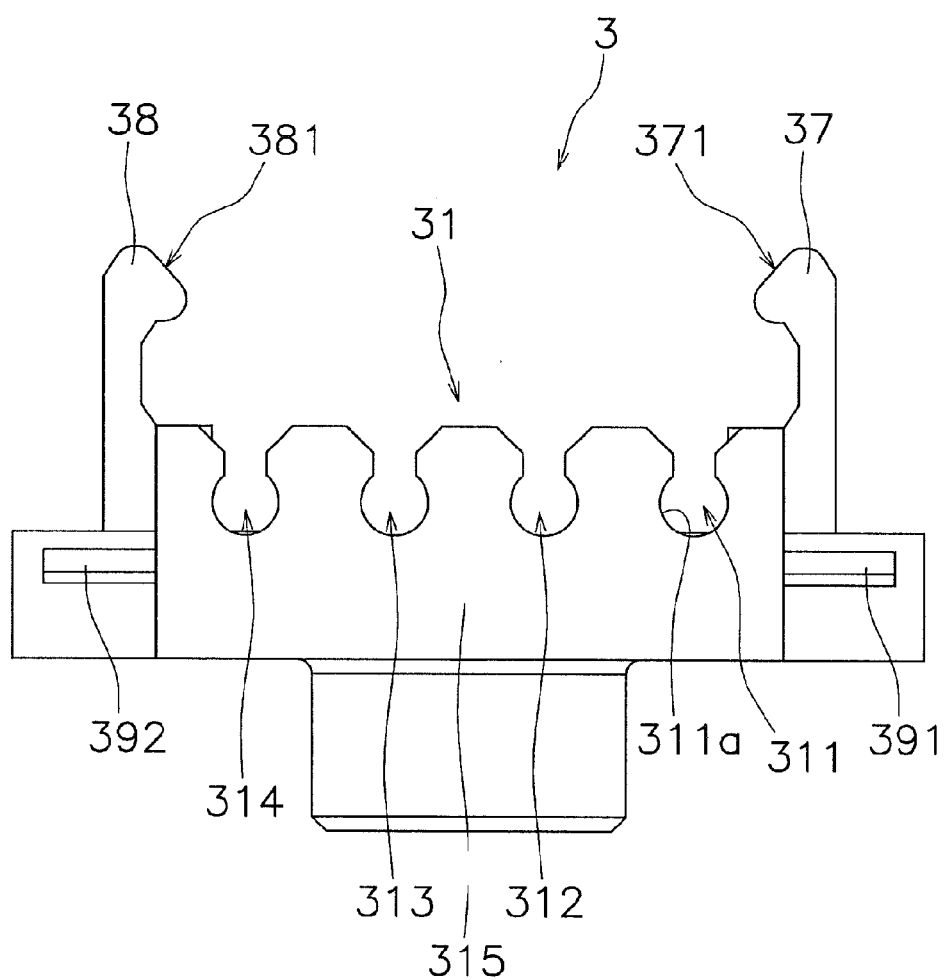
FIG. 10 is a front view of the holder.

FIG. 9 is a top view of holder 3. As illustrated in FIG. 9, first wire housing 311 extends longitudinally. First wire housing 311 reaches front end surface 315 of first wall 31. FIG. 10 is a front view of holder 3. As illustrated in FIG. 7 and FIG. 10, first wire housing 311 opens upward.

As illustrated in FIG. 7 and FIG. 9, first wall 31 includes a plurality of terminal housings 316-319. The plurality of terminal housings 316-319 respectively houses the plurality of connection terminals 26-29. More specifically, first wall 31 includes first terminal housing 316, second terminal housing 317, third terminal housing 318, and fourth terminal housing 319. First to fourth terminal housings 316-319 are mutually partitioned and arranged horizontally side by side. First terminal housing 316 is arranged intersecting with first wire housing 311. First terminal housing 316 houses first connection terminal 26. Second terminal housing 317 is arranged intersecting with second wire housing 312. Second terminal housing 317 houses second connection terminal 27. Third terminal housing 318 is arranged intersecting with third wire housing 313. Third terminal housing 318 houses third connection terminal 28. Fourth terminal housing 319 is arranged intersecting with fourth wire housing 314. Fourth terminal housing 319 houses fourth connection terminal 29.

First wire housing 311 includes first wire holder 311a and first wire guide part 311b. First wire holder 311a is located in front of first terminal housing 316. First wire guide part 311b is located behind first terminal housing 316.

Figure 11:
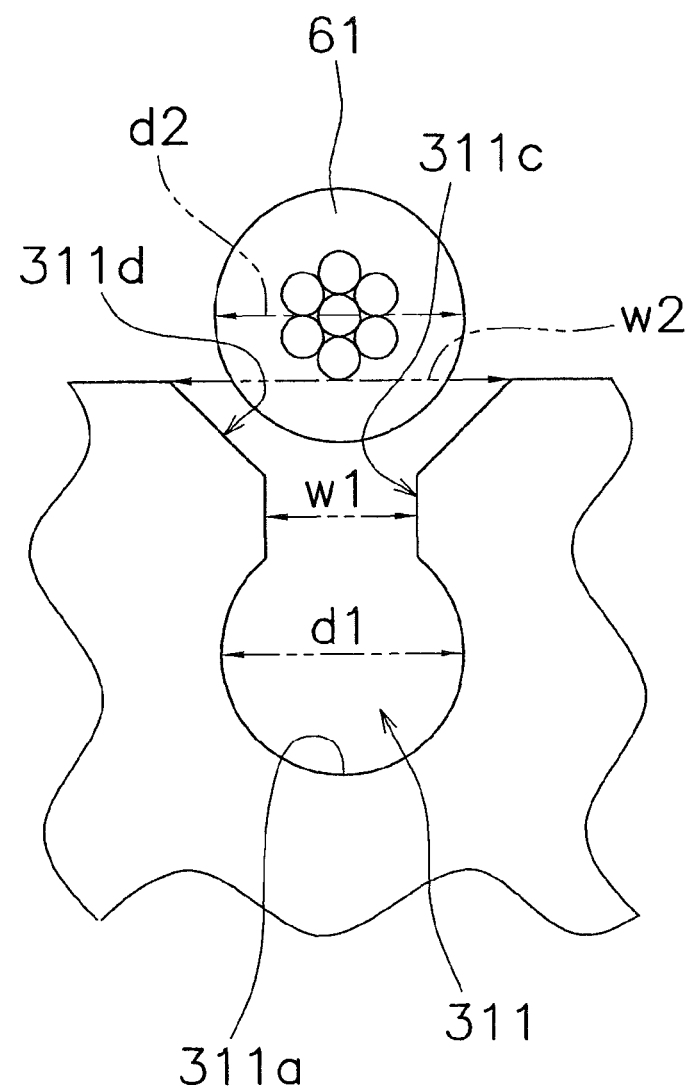
FIG. 11 is an enlarged view of a first wire holder.

FIG. 11 is an enlarged view of first wire holder 311a. Additionally, FIG. 11 shows a cross-section of first wire holder 311a and wire 61. As illustrated in FIG. 11, diameter d1 of first wire holder 311a is the same as, or smaller than diameter d2 of wire 61. Wire 61 is thereby supported inside first wire holder 311a and does not move.

Further, as illustrated in FIG. 11, first wire housing 311 includes first slot 311c. first slot 311c is located in first wire holder 311a for inserting wire 61. Width w1 of first slot 311c is smaller than diameter d2 of wire 61. Additionally, width w1 of first slot 311c is smaller than diameter d1 of first wire holder 311a.

First wire housing 311 includes expanded slot 311d. Expanded slot 311d is located above first slot 311c. The width of expanded slot 311d increases toward the upper portion thereof. Width w2 of the upper end part of expanded slot 311d is larger than diameter d2 of wire 61. This facilitates insertion of wire 61 into first slot 311c. second to fourth wire housings 312-314 are configured in the same manner as first wire housing 311, therefore the description thereof will be omitted.

Figure 12:
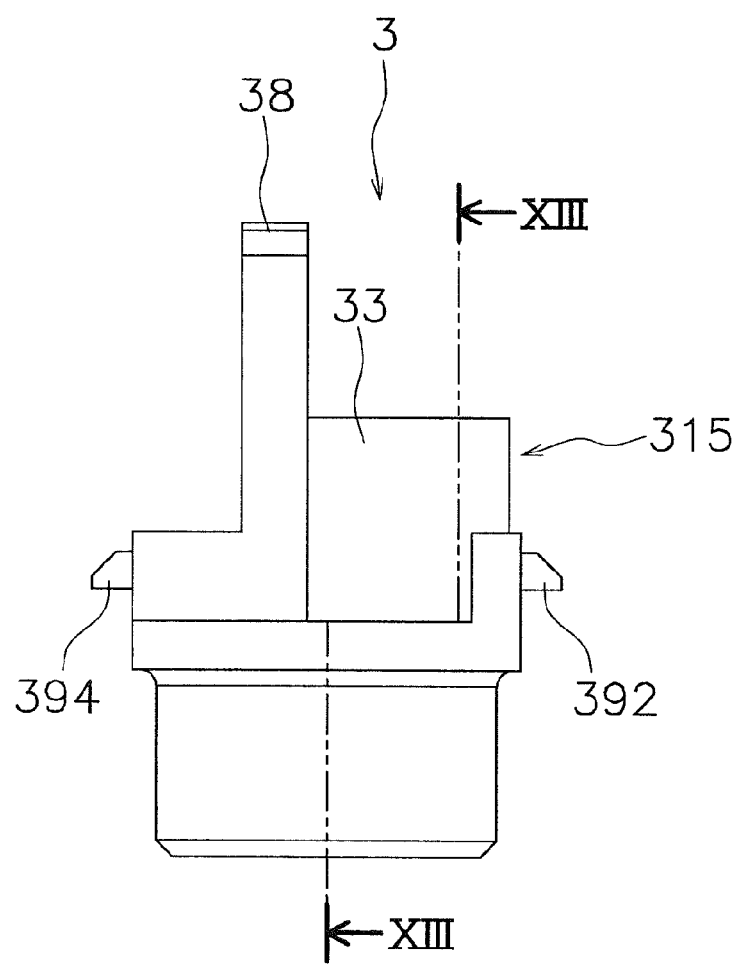
FIG. 12 is a side view of the holder.
Figure 13:
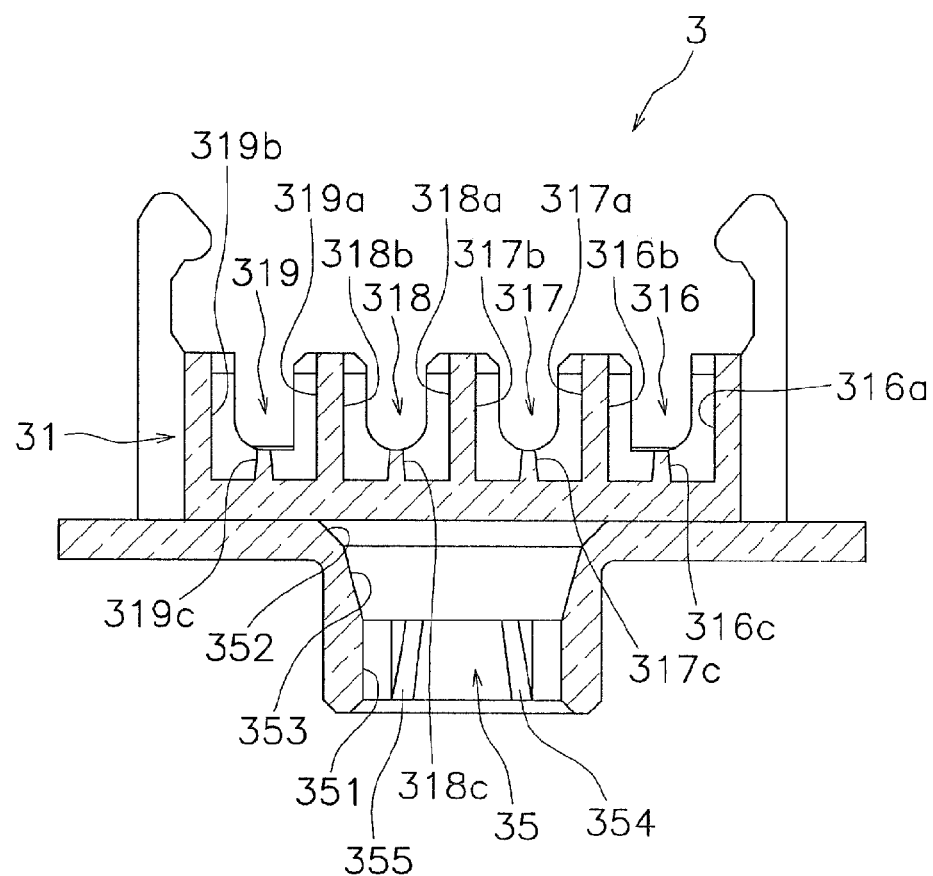
FIG. 13 is a cross-sectional view along XIII-XIII in FIG. 12.

FIG. 12 is a side view of holder 3. FIG. 13 is a cross-sectional view along XIII-XIII in FIG. 12. As illustrated in FIG. 7 and FIG. 13, first terminal housing 316 opens upward. As illustrated in FIG. 13, first terminal housing 316 includes a pair of first wall surfaces 316a, 316b. The pair of first wall surfaces 316a, 316b are arranged horizontally side by side. First connection terminal 26 is arranged between the pair of first wall surfaces 316a, 316b. Second terminal housing 317 includes a pair of second wall surfaces 317a, 317b. The pair of second wall surfaces 317a, 317b are arranged horizontally side by side. Second connection terminal 27 is arranged between the pair of second wall surfaces 317a, 317b. Third terminal housing 318 includes a pair of third wall surfaces 318a, 318b. The pair of third wall surfaces 318a, 318b are arranged horizontally side by side. Third connection terminal 28 is arranged between the pair of third wall surfaces 318a, 318b. Fourth terminal housing 319 includes a pair of fourth wall surfaces 319a, 319b. The pair of fourth wall surfaces 319a, 319b are arranged horizontally side by side. Fourth connection terminal 29 is arranged between the pair of fourth wall surfaces 319a, 319b.

As illustrated in FIG. 13, first wall 31 includes a plurality of protrusions 316c, 317c, 318c, and 319c. protrusions 316c, 317c, 318c, 319c are provided at the respective bottoms of the plurality of terminal housings 316-319. The bottom of each of terminal housings 316-319 faces the tip end of each of connection terminals 26-29 when terminal housings 316-319 house connection terminals 26-29. More specifically, first wall 31 includes first protrusion 316c, second protrusion 317c, third protrusion 318c, and fourth protrusion 319c. First protrusion 316c protrudes from the bottom of first terminal housing 316 toward slit 267 (refer to FIG. 4) in first connection terminal 26. Second protrusion 317c protrudes from the bottom of second terminal housing 317 toward slit 277 (refer to FIG. 4) in second connection terminal 27. Third protrusion 318c protrudes from the bottom of third terminal housing 318 toward slit 287 (refer to FIG. 4) in third connection terminal 28. fourth protrusion 319c protrudes from the bottom of fourth terminal housing 319 toward slit 297 (refer to FIG. 4) in fourth connection terminal 29.

Figure 14:
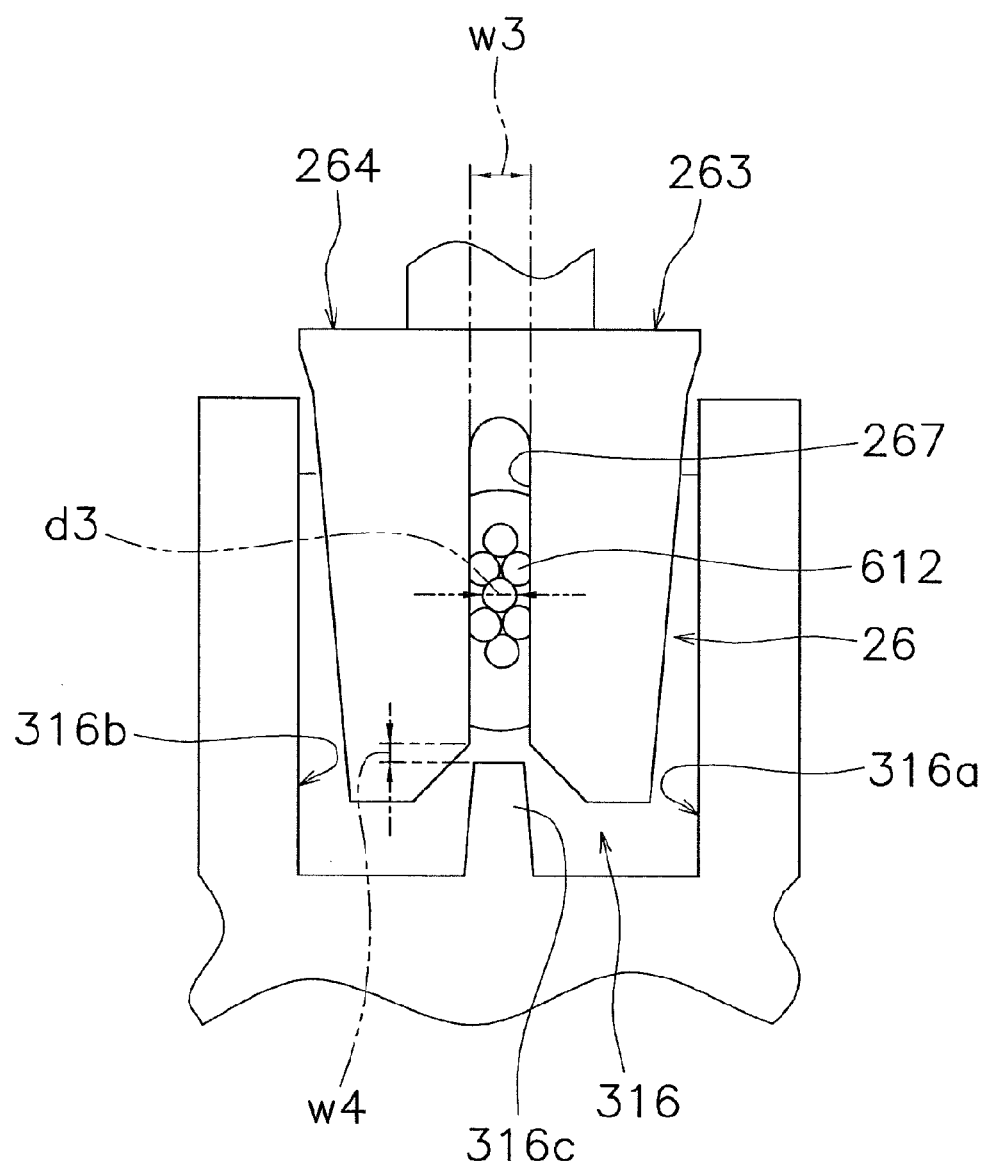
FIG. 14 is an enlarged view of the first connection terminal and the first terminal housing.

FIG. 14 is an enlarged view of first connection terminal 26 and first terminal housing 316. FIG. 14 illustrates first connection terminal 26 and first terminal housing 316 when first to fourth connection terminals 26-29 are arranged in a press-contact position with wires 61-64. As illustrated in FIG. 6, first connection terminal 26, oriented downward, pierces wire 61 and is thereby pressed into contact with wire 61. First connection terminal 26 pierces wire 61 such that first connection terminal 26 passes through inner coating 611 of wire 61 and comes in contact with core 612. Hereby, as illustrated in FIG. 14, core 612 is sandwiched in first connection terminal 26 inside slit 267, and first connection terminal 26 is thus connected to wire 61.

As illustrated in FIG. 6, width w3 of slit 267 in first connection terminal 26 is larger than diameter d3 of core 612. Additionally, width w3 of slit 267 in first connection terminal 26 is smaller than width w7 of a bundle of a plurality of cores 612 that are not in press contact. Accordingly, during press contact, as illustrated in FIG. 14, the deformation of a bundle of cores 612 thereby allows the bundle of cores 612 to be inserted into slit 267 in first connection terminal 26. Finally, in FIG. 6 and FIG. 14 only one portion of the plurality of cores 612 is given the reference sign 612.

When first to fourth connection terminals 26-29 are arranged in the press-contact position with wires 61-64, a gap is created between first protrusion 316c and first connection terminal 26 without first protrusion 316c coming into contact with first connection terminal 26. Hereby, it is possible for inner coating 611 of wire 61 to pass through the gap and escape from slit 267 when first connection terminal 26 is pressed into contact with wire 61. Distance w4 between first protrusion 316c and first connection terminal 26 is smaller than diameter d3 of core 612 in wire 61. Furthermore, first tiered-part 263 and second tiered-part 264 of first connection terminal 26 protrude upward from first terminal housing 316 when first to fourth connection terminals 26-29 are arranged in press-contact position with wires 61-64.

As illustrated in FIG. 7 and FIG. 9, holder 3 includes second wall 32 and third wall 33. Second wall 32 and third wall 33 are arranged separated from each other in the left and right direction. second wall 32 connects to the right end part of first wall 31. Third wall 33 connects to the left end part of first wall 31. The upper surfaces of first wall 31, second wall 32, and third wall 33 are all positioned at the same height. The upper surfaces of first wall 31, second wall 32, and third wall 33 are in contact with the bottom surface of sensor circuit assembly 2, and support sensor circuit assembly 2.

As illustrated in FIG. 7 and FIG. 8, holder 3 includes first catch 37 and second catch 38, which lock onto sensor circuit assembly 2. First catch 37 and second catch 38 are arranged separated from each other in the left and right direction. First catch 37 and second catch 38 extend to a position above the above described first wall 31, second wall 32, and third wall 33. The tip end parts of first catch 37 and second catch 38 are shaped to protrude toward each other. More specifically, the tip end part of first catch 37 protrudes leftward. The tip end part of second catch 38 protrudes rightward. Furthermore, the tip end part of first catch 37 and the tip end part of second catch 38 will be caught on the upper surface of seal part 25 when sensor circuit assembly 2 is placed between first catch 37 and second catch 38. Sensor circuit assembly 2 may thus be secured to holder 3.

As illustrated in FIG. 10, the tip end part of first catch 37 includes first inclined surface 371. The tip end part of second catch 38 includes second inclined surface 381. First inclined surface 371 and second inclined surface 381 are inclined so that the mutual distance therebetween widens toward the respective upper portions. Accordingly, pushing sensor circuit assembly 2 downward toward first catch 37 and second catch 38 thus widens the gap between first catch 37 and second catch 38, and thereby facilitates arranging sensor circuit assembly 2 between first catch 37 and second catch 38. Furthermore, first catch 37 and second catch 38 arrive at the locked position with sensor circuit assembly 2 when the above described first to fourth connection terminals 26-29 are arranged in the press-contact position with wires 61-64. Finally, as illustrated in FIG. 8, the bottom of sensor circuit assembly 2 is supported by the upper surfaces of first wall 31, second wall 32, and third wall 33 when first to fourth connection terminals 26-29 are arranged in the press-contact position with wires 61-64.

As illustrated in FIG. 7 and FIG. 9, holder 3 includes recess 34. The recess 34 is located between second wall 32 and third wall 33 in the left and right direction. The recess 34 is located behind first wall 31.

As illustrated in FIG. 9 and FIG. 13, holder 3 includes borehole 35. Borehole 35 passes vertically through holder 3. Borehole 35 is provided in the recess 34. As illustrated in FIG. 13, borehole 35 includes first bore section 351, second bore section 352, and third bore section 353. First bore section 351, second bore section 352, and third bore section 353 are arranged side by side along the axial direction of borehole 35. In other words, first bore section 351, second bore section 352, and third bore section 353 are arranged vertically side by side.

First bore section 351 is linear and extends vertically. The inner diameter of first bore section 351 is larger than the outer diameter of cable 6. Second bore section 352 includes the upper end section of borehole 35. In other words, second bore section 352 connects to the bottom of the recess 34. The inner diameter of second bore section 352 is larger than the inner diameter of first bore section 351. More specifically, the inner diameter of second bore section 352 is larger toward the upper portion thereof. Third bore section 353 is located between first bore section 351 and second bore section 352. The inner diameter of third bore section 353 is larger toward the upper portion thereof. The inner diameter of third bore section 353 is larger than the inner diameter of first bore section 351 and smaller than the inner diameter of second bore section 352.

Figure 15:
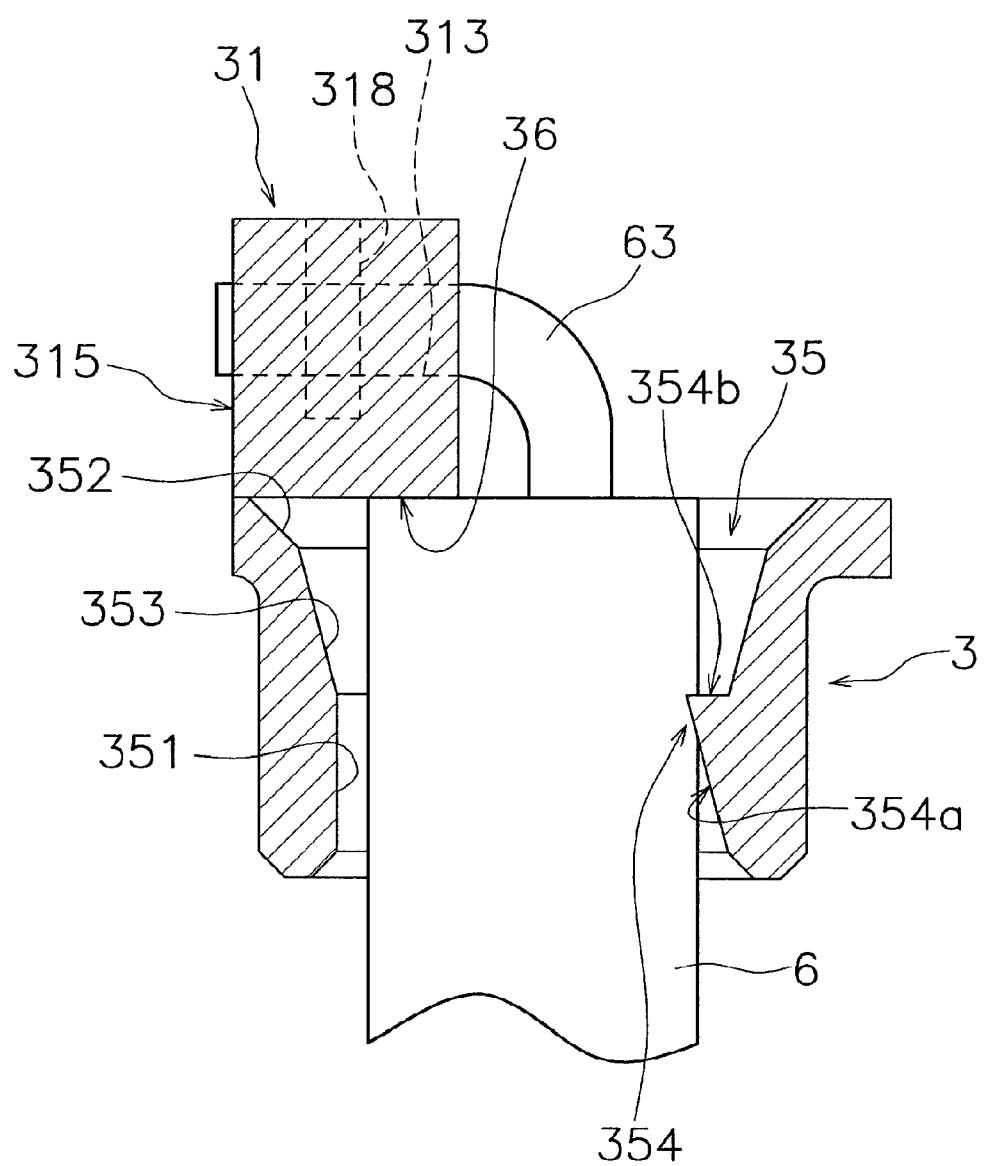
FIG. 15 is a cross-sectional view along XV-XV in FIG. 9.
Figure 16:
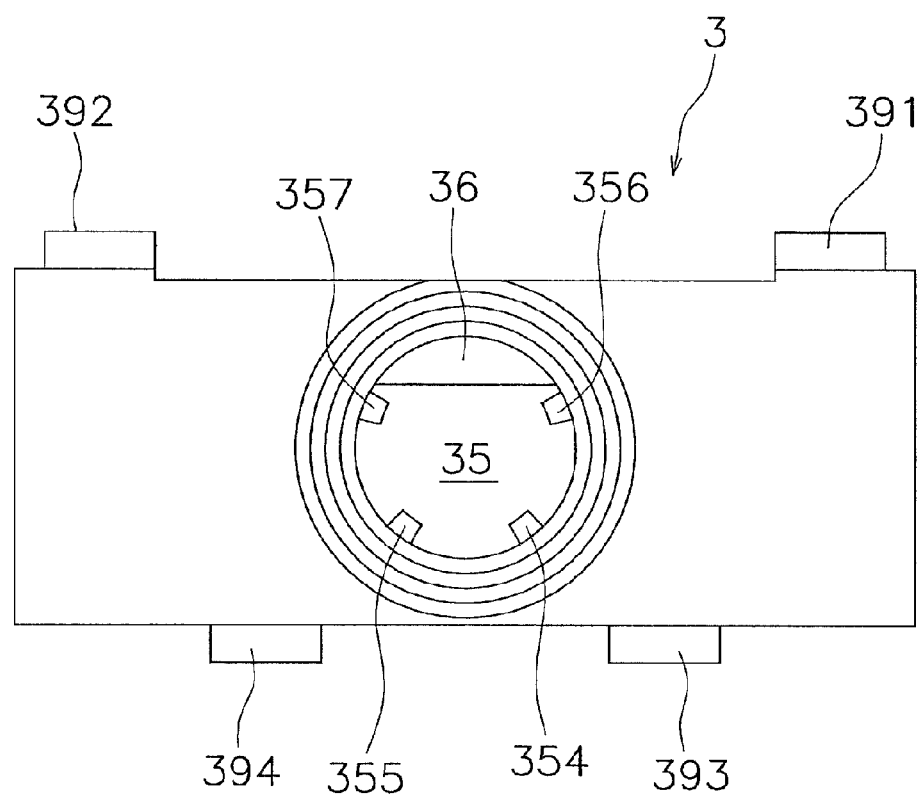
FIG. 16 is a bottom view of the holder.

FIG. 15 is a cross-sectional view along XV-XV in FIG. 9. FIG. 16 is a bottom view of holder 3. FIG. 15 schematically illustrates cable 6 inserted into borehole 35. As illustrated in FIG. 15 and FIG. 16, holder 3 includes positioning section 36. The positioning section 36 is arranged to overlap with one portion of borehole 35 at the upper portion of borehole 35. The positioning section 36 is the bottom surface of first wall 31.

As illustrated in FIG. 9 and FIG. 13, the inner surface of borehole 35 includes a plurality of protrusions 354-357. The plurality of protrusions 354-357 protrudes from the inner surface of borehole 35 toward the central axis of borehole 35. The plurality of protrusions 354-357 is arranged at equal intervals in the inner circumferential direction of borehole 35. The diameter of a circle passing through the tip ends of the plurality of protrusions 354-357 is smaller than the outer diameter of cable 6. Additionally, the protrusions 354-357 taper toward the central axis of borehole 35. Therefore, as illustrated in FIG. 15, when cable 6 is inserted into borehole 35, the tip ends of the protrusions 354-357 eat into the outer surface of cable 6. This prevents cable 6 from slipping out. More specifically, the inner surface of borehole 35 includes first protrusion 354, second protrusion 355, third protrusion 355, and fourth protrusion 357. As illustrated in FIG. 15, first protrusion 354 includes inclined surface 354a and catch surface 354b. The inclined surface 354a is inclined in relation to the axial direction of borehole 35. The inclined surface 354a is inclined so that the upper portion of the inclined surface approaches the central axis of borehole 35. The catch surface 354b protrudes from the inner surface of borehole 35 toward the central axis of borehole 35, and catches the outer surface of cable 6. Second to fourth protrusions 355-357 are configured in the same manner as first protrusion 354; therefore the description thereof will be omitted. The above-mentioned kind of shape of the plurality of protrusions 354-357 facilitates the insertion of cable 6 upward into borehole 35 while restricting the downward movement of cable 6 in borehole 35.

As above described, the inner diameter of borehole 35 is larger than the outer diameter of cable 6. Additionally the plurality of protrusions 354-357 supports cable 6, resulting in a gap between cable 6 and borehole 35. An adhesive may be poured into this gap, and cable 6 may be bonded to the inner surface of borehole 35 with the adhesive.

Figure 17:
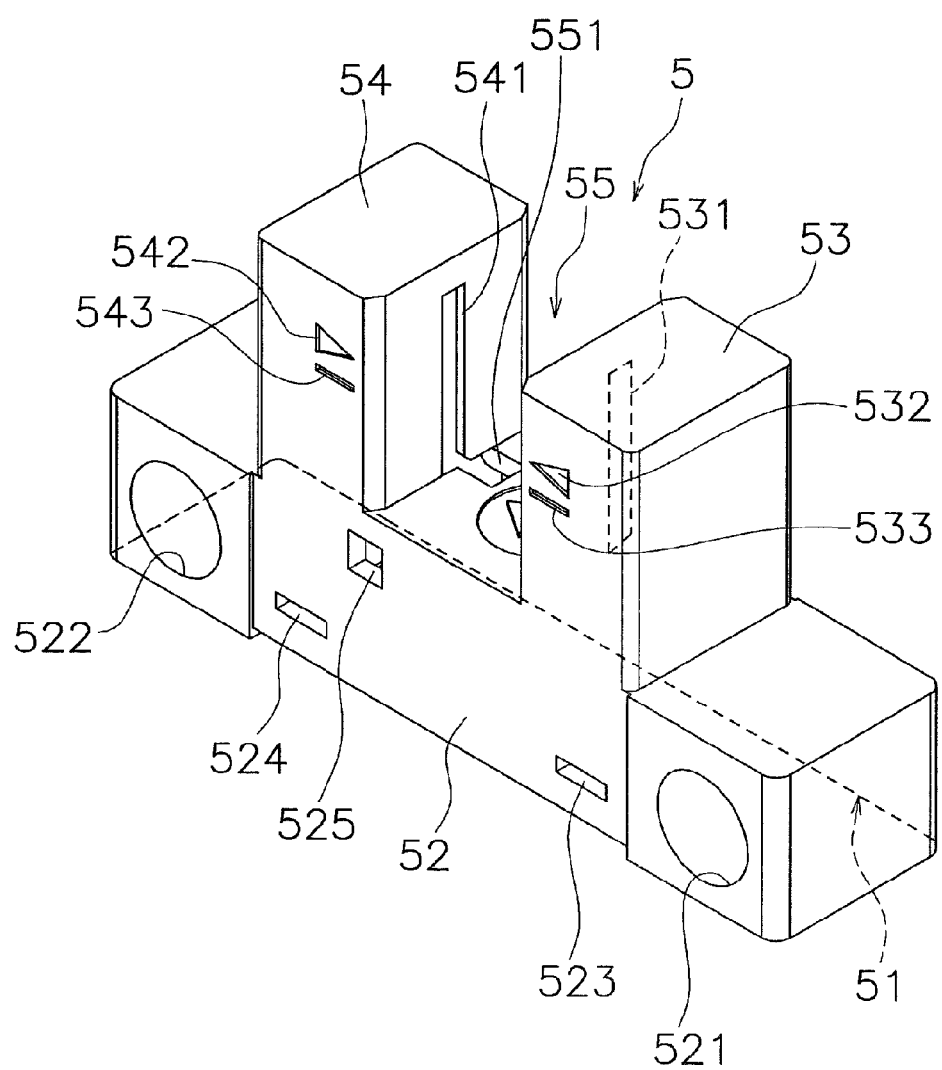
FIG. 17 is a perspective view of the main case.

FIG. 17 is a perspective view of main case 5. Main case 5 includes an internal space for housing sensor circuit assembly 2 and holder 3. The bottom surface of main case 5 is provided with opening 51. Thus the internal space in main case 5 opens downward. Sensor circuit assembly 2 and holder 3 pass through the opening 51 to be arranged in the internal space of main case 5.

As illustrated in FIG. 17, main case 5 includes first mounting hole 521 and second mounting hole 522 for mounting main case 5 to various kinds of machinery. First mounting hole 521 and second mounting hole 522 pass longitudinally through main case 5. Front surface 52 of main case 5 includes first fastening hole 523 and second fastening hole 524. As illustrated in FIG. 7, the front surface of holder 3 includes first fastening protrusion 391 and second fastening protrusion 392. First fastening protrusion 391 locks together with first fastening hole 523. Second fastening protrusion 392 locks together with second fastening hole 524. Hereby main case 5 may be secured to holder 3. Moreover, as illustrated in FIG. 9, the rear surface of holder 3 includes third fastening protrusion 393 and fourth fastening protrusion 394. Although not illustrated, the rear surface of main case 5 includes third fastening hole and fourth fastening hole. Third fastening protrusion 393 on holder 3 locks together with the third fastening hole. Fourth fastening protrusion 394 on holder 3 locks together with the fourth fastening hole.

As illustrated in FIG. 7 and FIG. 9, holder 3 includes first end surface 321 and second end surface 322. First end surface 321 and second end surface 322 are one portion of the front surface of holder 3. The above described first fastening protrusion 391 protrudes frontward from first end surface 321. Second fastening protrusion 392 protrudes frontward from second end surface 322. Front end surface 315 of first wall 31 is located between first end surface 321 and second end surface 322 in the left and right direction. Front end surface 315 of first wall 31 is recessed further behind first end surface 321 and second end surface 322.

As illustrated in FIG. 17, main case 5 includes light-emitter case 53, light-receiver case 54, and detection groove 55. Light-emitter case 53 houses light emitting element 211. Light-receiver case 54 houses light receiving element 221. Light-emitter case 53 and light-receiver case 54 are arranged separated from each other in the left and right direction. Detection groove 55 is located between light-emitter case 53 and light-receiver case 54.

Light-emitter case 53 includes light-emitter slit 531. Light-emitter slit 531 extends vertically. Light-emitter slit 531 extends from at least location facing light emitting element 211 up to the bottom of detection groove 55. More specifically, light-emitter slit 531 extends from location facing light-emitter lens part 212 up to the bottom of detection groove 55.

Light-receiver case 54 includes light-receiver slit 541. Light-receiver slit 541 is arranged facing light-emitter slit 531. Light-receiver slit 541 extends vertically. Light-receiver slit 541 extends from at least location facing light receiving element 221 up to the bottom of detection groove 55. Light-receiver slit 541 extends from location facing light-receiver lens part 222 up to the bottom of detection groove 55.

Main case 5 includes element position marks 532, 542 and detection depth marks 533, 543. Element position marks 532, 542 are arranged at positions corresponding to light receiving element 221 and light emitting element 211. More specifically, element position marks 532, 542 are arranged at positions corresponding to the center position of light-emitter lens part 212 and the center position of light-receiver lens part 222. Detection depth marks 533, 543 indicate the detection depth required for detecting an object to be detected in detection groove 55. That is, light receiving element 221, and light emitting element 211 will stably detect an object when the object arrives at a location in detection groove 55 exceeding the detection depth.

Element position marks 532, 542, and detection depth marks 533, 543 are symbols that are added to main case 5. Element position marks 532, 542 may be respectively added to the front surfaces of light-emitter case 53 and light-receiver case 54. Detection depth marks 533, 543 may be respectively added to the front surfaces of light-emitter case 53 and light-receiver case 54. In the present embodiment, element position marks 532, 542 are triangular symbols. Detection depth marks 533, 543 are bar symbols. Recesses and projections in main case 5 form element position marks 532, 542, and detection depth marks 533, 543. More specifically, element position marks 532, 542 are hollowed out of the surface of main case 5. Additionally, detection depth marks 533, 543 are hollowed out of the surface of main case 5. Although not illustrated, element position marks 532, 542 may also be respectively placed on the rear surface of light-emitter case 53 and the rear surface of light-receiver case 54. Additionally detection depth marks 533, 543 may be respectively placed on the rear surfaces of light-emitter case 53 and light-receiver case 54.

Main case 5 includes at least one indicator window 525, 551. More specifically, main case 5 includes first indicator window 525, second indicator window 551, and third indicator window (not shown). First indicator window 525 is provided on the front surface 52 of main case 5. Second indicator window 551 is provided on the bottom of detection groove 55. The third indicator window is provided on the rear surface of main case 5. First indicator window 525, second indicator window 551, and the third indicator window are arranged to face projection 251 in sensor circuit assembly 2.

Figure 18:
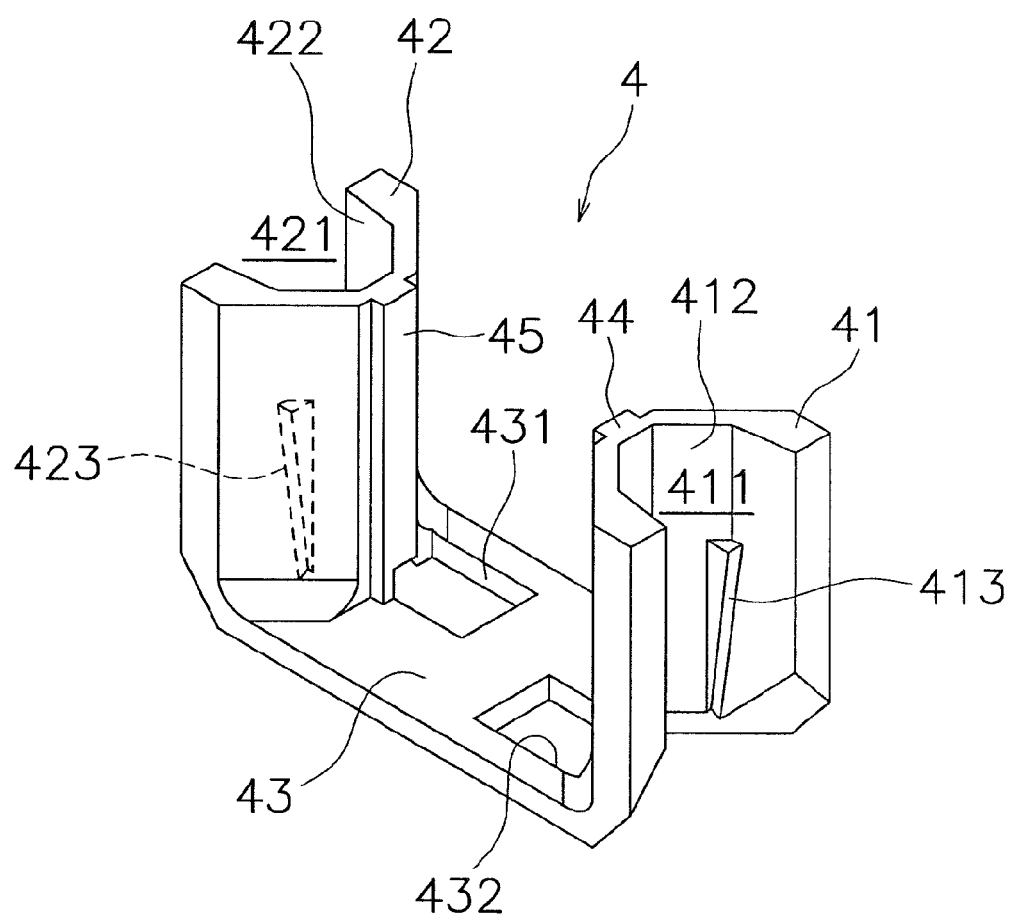
FIG. 18 is a perspective view of the sub case.

FIG. 18 is a perspective view of sub case 4. Sub case 4 is arranged between main case 5 and sensor circuit assembly 2. Sub case 4 prevents the transmission of disturbance light, while allowing efficient transmission of infrared light. Sub case 4 may be made from resin, for example.

Sub case 4 includes light-emitter cover 41, light-receiver cover 42, and connecting case 43. Connecting case 43 connects light-emitter cover 41 and light-receiver cover 42. Light-emitter cover 41 includes first housing space 411 into which light emitting element 211 is disposed. Light-emitter cover 41 covers light emitting element 211 from the light emission direction of light emitting element 211. Opposite the light emission direction, first housing space 411 is open across the entire light-emitter cover 41 in the vertical direction. That is, the right portion of first housing space 411 is entirely open in the vertical direction. First housing space 411 passes vertically through light-emitter cover 41.

Light-receiver cover 42 includes second housing space 421 into which light receiving element 221 is disposed. Light-receiver cover 42 covers light receiving element 221 from the light receiving direction of light receiving element 221. Opposite the light receiving direction, second housing space 421 is open across the entire light-receiver cover 42 in the vertical direction. That is, the left portion of second housing space 421 is entirely open in the vertical direction. Second housing space 421 passes vertically through light-receiver cover 42.

An inner surface 412 near first housing space 411 of light-emitter cover 41 tapers toward the light emission direction. In other words, the inner surface 412 of light-emitter cover 41 tapers towards light receiving element 221. Therefore, when sub case 4 is mounted to sensor circuit assembly 2, light-emitter lens part 212 comes into contact with the inner surface 412 of light-emitter cover 41 to thereby position light-emitter cover 41. Inner surface 422 near second housing space 421 of light-receiver cover 42 tapers toward the light receiving direction. In other words, the inner surface 422 of light-receiver cover 42 tapers toward light emitting element 211. Therefore, when sub case 4 is mounted to sensor circuit assembly 2, light-receiver lens part 222 comes into contact with the inner surface 422 of light-receiver cover 42 to thereby position light-receiver cover 42.

A protrusion 413 is provided on the inner surface 412 of light-emitter cover 41. The upper end part of the protrusion 413 comes into contact with the bottom surface of light-emitter lens part 212 when light-emitter lens part 212 is arranged in first housing space 411. Protrusion 423 is provided on the inner surface 422 of light-receiver cover 42. The upper end part of the protrusion 423 comes into contact with the bottom surface of light-receiver lens part 222 when light-receiver lens part 222 is arranged in second housing space 421. Hereby, sensor circuit assembly 2 is prevented from slipping downward in relation to sub case 4.

Sub case 4 includes light-emitter window 44 and light-receiver window 45. Light-emitter window 44 includes protrusion that protrudes from light-emitter cover 41 toward the light emission direction. Light-emitter window 44 extends vertically. The shape of light-emitter window 44 matches the shape of the above described light-emitter slit 531 in main case 5. Light-emitter window 44 is inserted into light-emitter slit 531. Light-receiver window 45 includes protrusion that protrudes from light-receiver cover 42 toward the light receiving direction. Light-receiver window 45 extends vertically. The shape of light-receiver window 45 matches the shape of the above described light-receiver slit 541 in main case 5. Light-receiver window 45 is inserted into light-receiver slit 541.

Sub case 4 includes first indicator opening 431 and second indicator opening 432. First indicator opening 431 and second indicator opening 432 are provided in connecting case 43. First indicator opening 431 is arranged facing projection 251 on sensor circuit assembly 2. Projection 251 is arranged inside first indicator opening 431 when sub case 4 is mounted on sensor circuit assembly 2. Second indicator opening 432 mirrors the shape of first indicator opening 431 about a symmetry axis extending in the vertical direction. Additionally, sub case 4 is symmetrical about the symmetry axis extending in the vertical direction. Accordingly, it is possible to mount sub case 4 on sensor circuit assembly 2 in the reverse of the above described orientation. That is, along with mounting light-emitter cover 41 on light-receiver lens part 222, light-receiver cover 42 may be mounted on light-emitter lens part 212. If mounted in this manner, projection 251 on sensor circuit assembly 2 will be arranged inside second indicator opening 432.

Figure 19A:
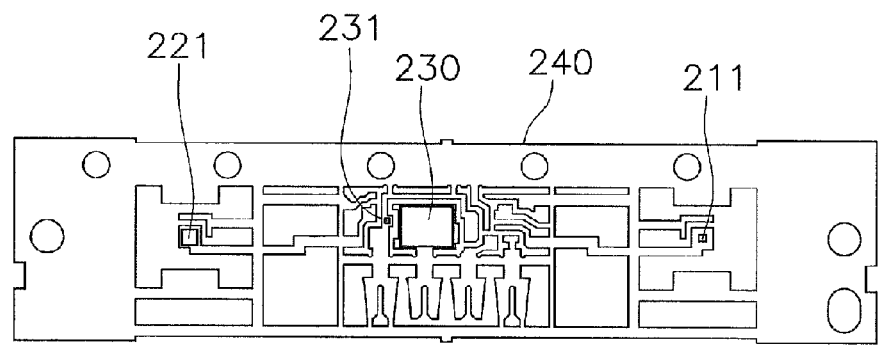
FIGS. 19A, 19B and 19C illustrate a process for manufacturing the sensor body.
Figure 19B:
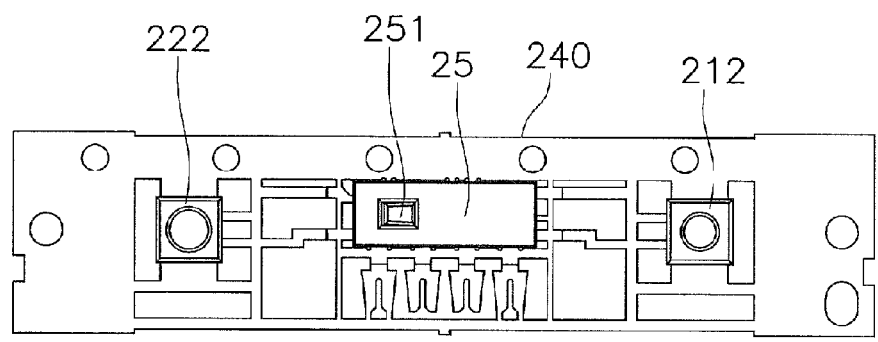

Next, the process of manufacturing photosensor 1 will be described. FIGS. 19A and 19B illustrate a process for manufacturing sensor circuit assembly 2. In the process illustrated in FIG. 19A a sheet like frame is punched via stamping to thereby form lead frame 240 of a prescribed shape. Further, IC chip 230 of circuit 23, operation indicator 231, light emitting element 211, and light receiving element 221 are mounted to lead frame 240.

Next, in the process illustrated in FIG. 19B, seal part 25, light-emitter lens part 212, and light-receiver lens part 222 are cast on lead frame 240. Seal part 25, light-emitter lens part 212, and light-receiver lens part 222 are all formed from the same of casting material; therefore seal part 25, light-emitter lens part 212, and light-receiver lens part 222 may all be cast at one time from a shared die.

Figure 19C:
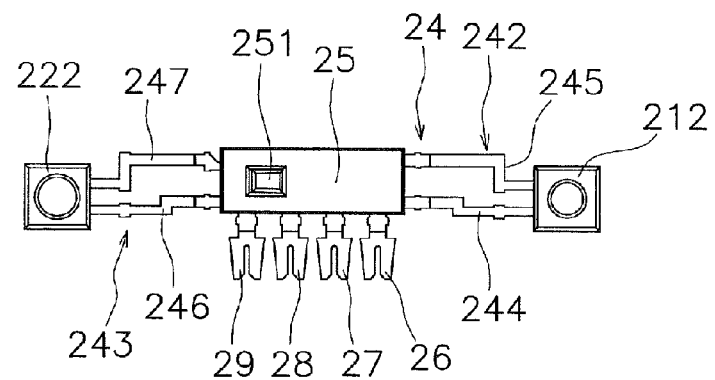

Next, in the process illustrated in FIG. 19C, the unneeded portions of lead frame 240 are removed to form the above described lead frame 24 for sensor circuit assembly 2. Thereafter, light-receiver leads 243, and light-emitter leads 242 are bent upward. Further, the first to fourth connection terminals 26-29 are bent downward.

Figure 20:
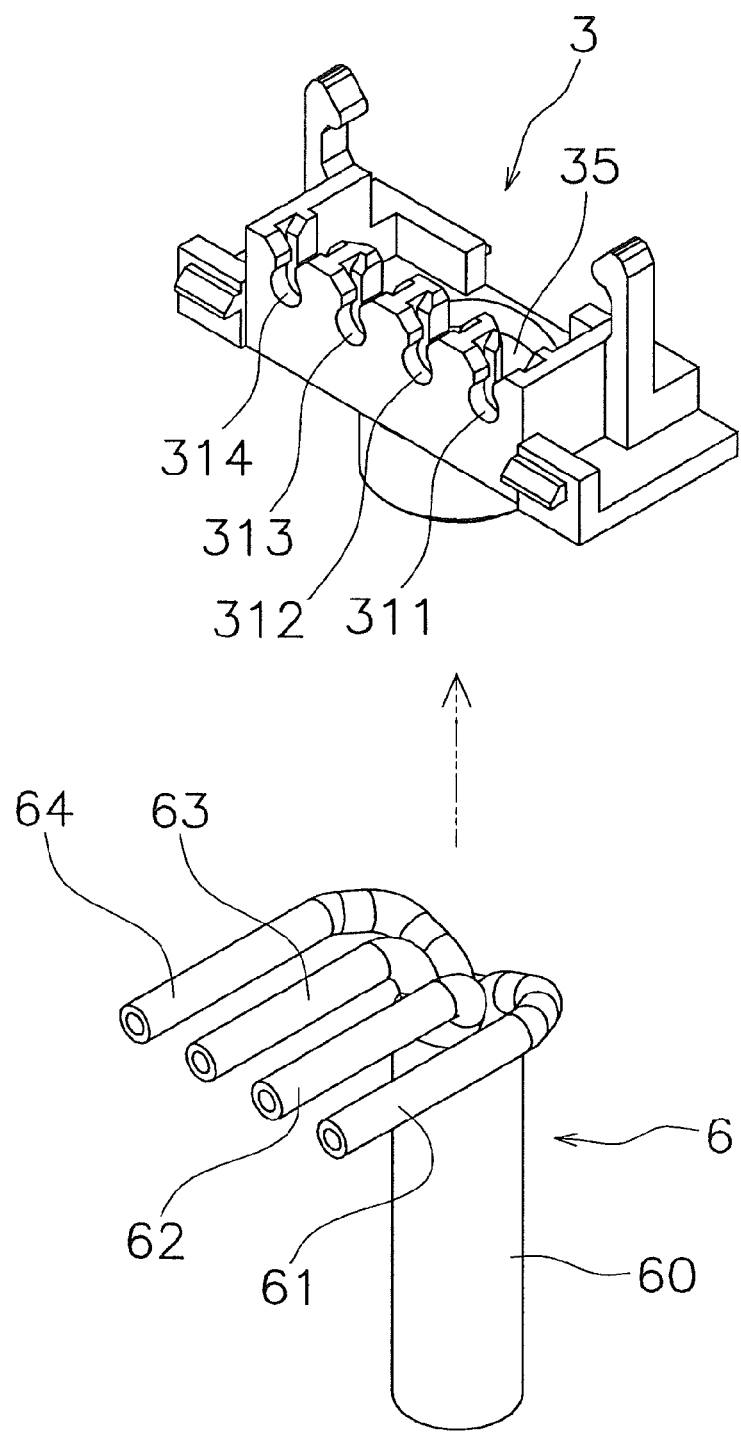
FIG. 20 illustrates an assembly process for the photosensor.
Figure 21:
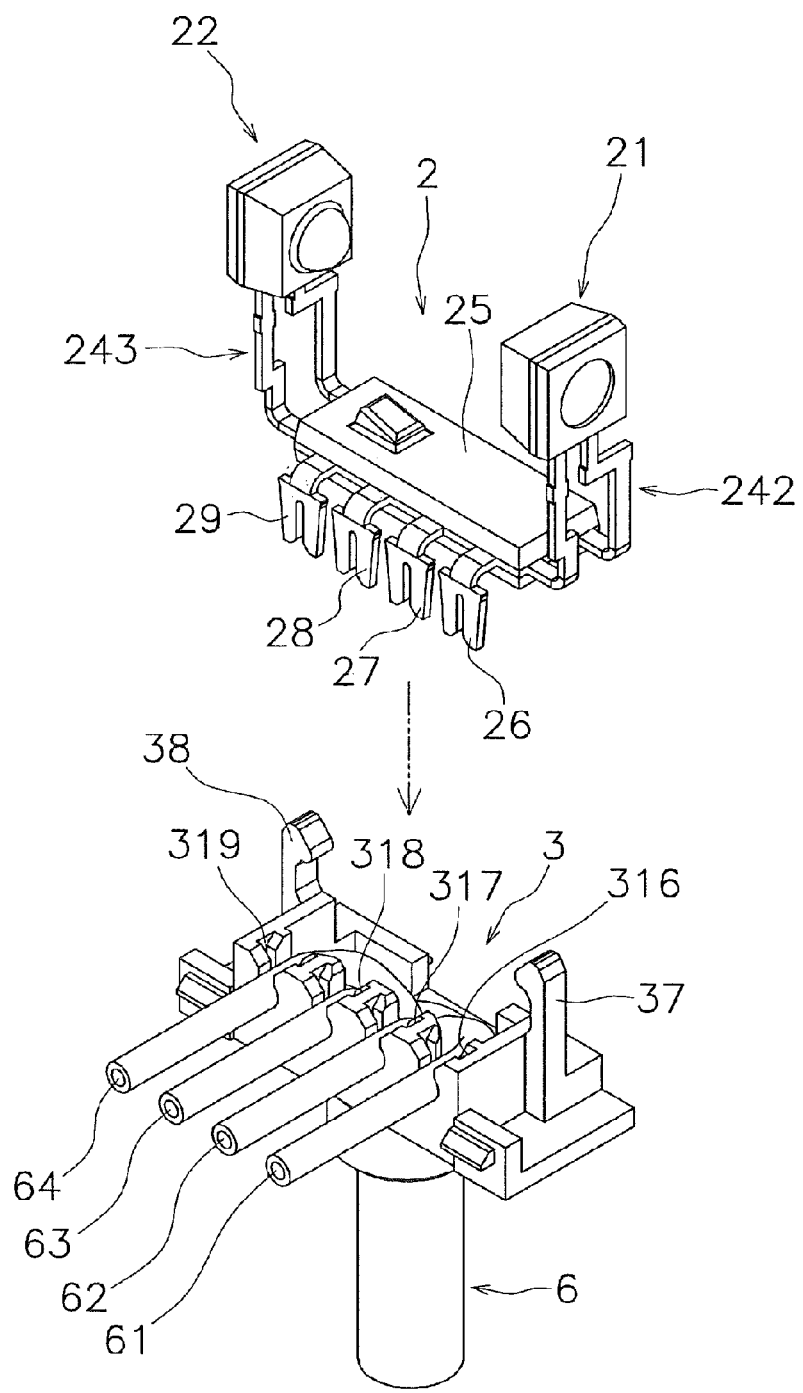
FIG. 21 illustrates an assembly process for the photosensor.
Figure 22:
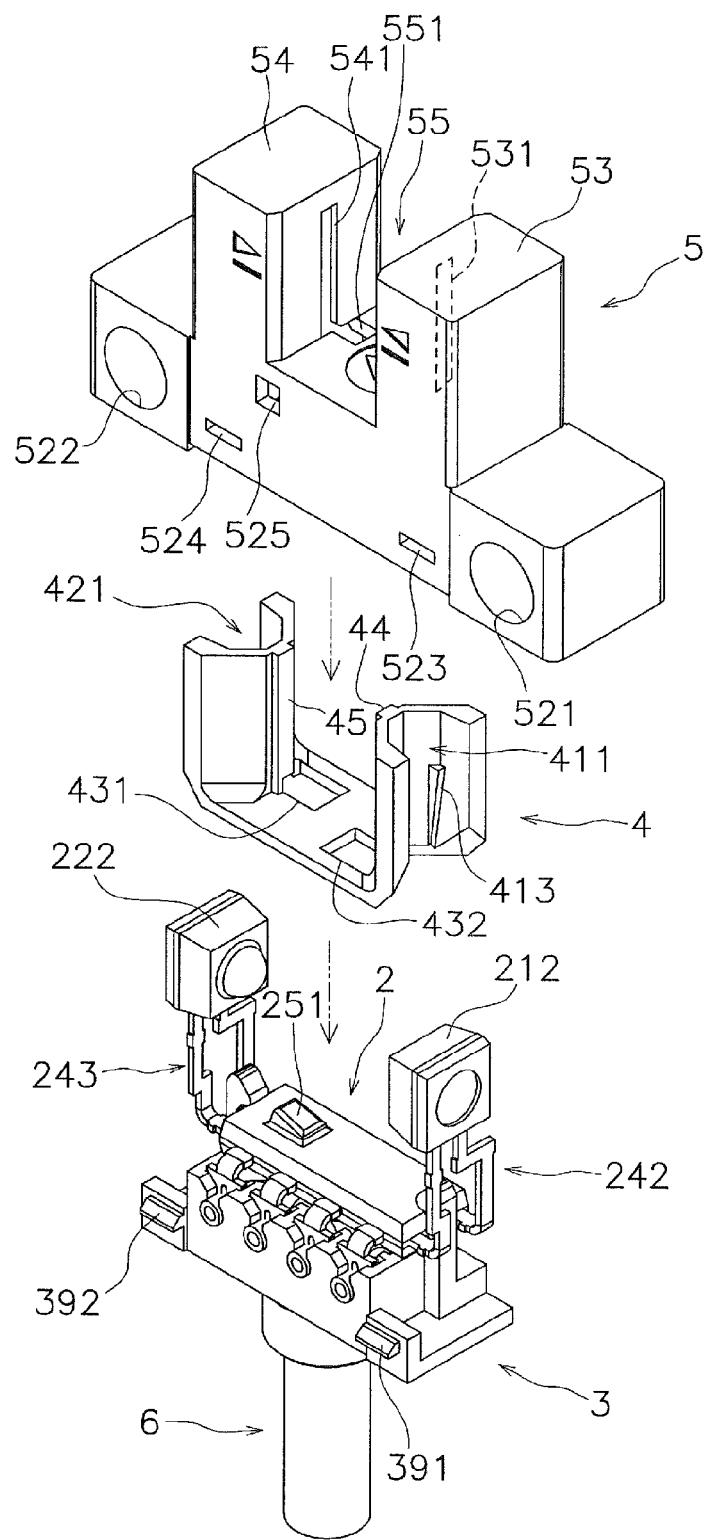
FIG. 22 illustrates an assembly process for the photosensor.

FIG. 20 to FIG. 22 illustrate the assembling of photosensor 1. First, in the process illustrated in FIG. 20, cable 6 is installed in holder 3. To install the cable, a plurality of wires 61-64 are exposed by preliminarily cutting outer coating 60 at the tip end part of cable 6. Next, exposed wires 61-64 and outer coating 60 of cable 6 are moved upward toward holder 3 and inserted into borehole 35 in holder 3. Thereafter, wires 61-64 are pulled toward the front and inserted into the first to fourth wire housings 311-314.

Next, in the process illustrated in FIG. 21, sensor circuit assembly 2 is mounted on holder 3. To mount the assembly, sensor circuit assembly 2 is moved downward toward holder 3. First to fourth connection terminals 26-29 are thereby each inserted into first to fourth terminal housings 316-319. At this point, first to fourth connection terminals 26-29 pierce wires 61-64 inside first to fourth wire housings 311-314, and press into contact with wires 61-64. When sensor circuit assembly 2 is pressed downward towards holder 3 until sensor circuit assembly 2 is caught on first catch 37 and second catch 38 of holder 3, first to fourth connection terminals 26-29 arrive at the press-contact position to complete press-contact between first to fourth connection terminals 26-29 and wires 61-64. Finally, any excess wires protruding from front end surface 315 of first wall 31 are cut.

Next, in the process illustrated in FIG. 22, sub case 4 is mounted on sensor circuit assembly 2. Sub case 4 is moved downward toward sensor circuit assembly 2 to cover sensor circuit assembly 2 with sub case 4. Hereby, light-emitter lens part 212 is arranged inside first housing space 411. Further, light-receiver lens part 222 is arranged inside second housing space 421.

Main case 5 is then mounted on holder 3. Main case 5 is moved downward toward sensor circuit assembly 2 and holder 3 to cover sensor circuit assembly 2, holder 3, and sub case 4 with main case 5. Hereby, sensor circuit assembly 2, holder 3, and sub case 4 are arranged in the internal space in main case 5. Furthermore, light-emitter window 44 of sub case 4 is inserted into light-emitter slit 531, and light-receiver window 45 is inserted in light-receiver slit 541.

The effects of photosensor 1 according to the present embodiment are as follows. Light emitting element 211, light receiving element 221, and seal part 25 are integrated with photosensor 1. Therefore, it is possible to install sensor circuit assembly 2, which includes light emitting element 211, light receiving element 221, and seal part 25, in a unified manner in holder 3. Further, first to fourth connection terminals 26-29 are pressed into contact with each of wires 61-64 and soldering is therefore unnecessary. Thus, the number of manufacturing man-hours decreases.

Further, soldering is no longer necessary, therefore even if there is small distance between seal part 25 and first to fourth connection terminals 26-29, it is possible to prevent the effects of heat on circuit 23 and seal part 25. Thus, the reliability of the device improves. Moreover, given that the tips of first to fourth connection terminals 26-29 are arranged oriented downward, moving sensor circuit assembly 2 downward facilitates pressing first to fourth connection terminals 26-29 into contact with wires 61-64. In this manner, photosensor 1 according to the present embodiment has increased reliability and a reduced number of manufacturing man-hours.

In particular, if the plurality of connection terminals is arranged side by side as in the present embodiment, for a small-sized photosensor the distance between the connection terminals may be extremely small. In this case, it would not be prudent to solder a wire to each of the connection terminals as that would lead to a short circuit between adjacent connection terminals. However, in photosensor 1 according to the present embodiment, the plurality of connection terminals 26-29 is connected to wires 61-64 by being pressed into contact therewith, thereby addressing the above-mentioned types of problems.

Moreover, first connection terminal 26 includes first pressure part 260, and therefore first connection terminal 26 may be pressed into contact by pressing down first pressure part 260. Accordingly, it is possible to reduce load on seal part 25 compared to case where seal part 25 needs to be pressed to make the press contact. Thus, the reliability of the device improves.

Each of connection terminals 26-29 protrudes longitudinally from seal part 25 and curves downward. Therefore, pressure parts 260, 270, 280, 290 of connection terminals 26-29 are arranged outside the region on which seal part 25 projects in the press-contact direction. Accordingly, when pressure parts 260, 270, 280, 290 of each of connection terminals 26-29 are pushed from above, seal part 25 will not obstruct the pressure parts. This facilitates press contact. Additionally pressure parts 260, 270, 280, 290 are one portion of the edge face of connection terminals 26-29 as a sheet thickness of connection terminals 26-29. This thus facilitates the forming of pressure parts 260, 270, 280, and 290. Moreover, pressure parts 260, 270, 280, 290 are provided on each of connection terminals 26-29. Therefore, each of connection terminals 26-29 may be uniformly pressed, compared to providing the pressure part on only one portion of connection terminals 26-29. Each of connection terminals 26-29 may thereby be accurately pressed into contact.

Pressing into contact may be achieved by pushing first to fourth connection terminals 26-29 onto wires 61-64, so that first to fourth connection terminals 26-29 cut through the inner coating of wires 61-64 to come into contact with the cores. Therefore, the terminals may be easily pressed into contact without first cutting the inner coating of wires 61-64 in advance. Thus, the number of manufacturing steps decreases.

Wire housings 311-314 are mutually partitioned. Therefore, wires 61-64 may be prevented from coming into contact with each other.

The plurality of wire housings 311-314 extends longitudinally. Accordingly, when manufacturing photosensor 1, wires 61-64 may be arranged along the front and rear direction in wire housings 311-314. Further, moving connection terminals 26-29 downward and pushing the terminals onto wires 61-64 thereby facilitates pressing terminals 26-29 into contact.

Cable 6 is arranged to pass through borehole 35. Borehole 35 passes vertically through holder 3. Accordingly, direction cable 6 is inserted through borehole 35, and direction wires 61-64 are arranged in wire housings 311-314 are orthogonal. Therefore, wires 61-64 will be prevented from pushing up sensor circuit assembly 2 when cable 6 is inserted, compared to having the same direction for inserting cable 6 into borehole 35, and for arranging wires 61-64.

The width of first slot 311c in first wire housing 311 is smaller than diameter d2 of wire 61. Therefore, it is possible to improve the retention force of first wire housing 311 on wire 61. In other words, wire 61 will tend not to slip out from first wire housing 311. Further, it is possible to have some sense of inserting wire 61 when wire 61 passes through first slot 311c and is inserted into first wire housing 311. Hereby, when manufacturing photosensor 1, a worker can easily determine whether installation of wire 61 into first wire housing 311 is complete. The second to fourth wire housings 312-314 provide the same effects as first wire housing 311.

First to fourth terminal housings 316-319 are mutually partitioned. Therefore, the adjacent connection terminals may be prevented from coming into contact with each other.

First terminal housing 316 is arranged intersecting with first wire housing 311. With this arrangement, inserting first connection terminal 26 into first terminal housing 316 facilitates first connection terminal 26 in piercing wire 61, which is arranged inside first wire housing 311. The second to fourth connection terminals provide the same effects as first connection terminal 26.

First connection terminal 26 is arranged between the pair of first wall surfaces 316a, 316b. Therefore, the amount of deformation of first connection terminal 26 while first connection terminal 26 is being pressed into contact is restricted by the pair of first wall surfaces 316a, 316b. Hereby, it is possible to secure a stronger press contact between first connection terminal 26 and the wire. Second to fourth connection terminals 27-29 provide the same effects as first connection terminal 26.

First protrusion 316c protrudes toward slit 267 in first connection terminal 26, within first connection terminal housing 316. Therefore, during press contact, first protrusion 316c pushes core 612 of wire 61 into slit 267 of first connection terminal 26. Therefore during press contact, this prevents core 612 from escaping from slit 267 in first connection terminal 26. Hereby, an accurate connection between first connection terminal 26 and core 612 may be established. Second to fourth connection terminals 27-29 provide the same effects as first connection terminal 26.

First catch 37 and second catch 38 arrive at the locked position with sensor circuit assembly 2 while the above described first to fourth connection terminals 26-29 are being arranged in the press-contact position with wires 61-64. As a result, the locking of first catch 37 and second catch 38 onto sensor circuit assembly 2, maintains a firm initial press contact between first to fourth connection terminals 26-29 and wires 61-64. Furthermore, during press contact, when first to fourth connection terminals 26-29 are arranged in the press-contact position with wires 61-64, first catch 37 and second catch 38 arrive at the locked position with sensor circuit assembly 2. Therefore, a worker easily determine that press contact of first to fourth connection terminals 26-29 is complete when first catch 37 and second catch 38 lock onto sensor circuit assembly 2.

Light-emitter leads 242 and light-receiver leads 243 bend upward. First to fourth connection terminals 26-29 curve downward. Therefore, when first to fourth connection terminals 26-29 are pressed downward and pressed into contact with wires 61-64, light-emitter leads 242 and light-receiver leads 243 will tend not to obstruct the pressing into contact.

First to fourth connection terminals 26-29 are provided on only first side 252 of first side 252 and second side 253. If connection terminals are provided on both first side 252 and second side 253, a force must be evenly applied to the connection terminals on first side 252 and the connection terminals on second side 253, however this is hard to achieve. Additionally, to apply a force to the connection terminals on first side 252 and the connection terminals on second side 253 evenly, the most effective means would be to press down on seal part 25 which is between first side 252 and second side 253, making it likely that seal part 25 will break. Whereas, in the present embodiment, first to fourth terminals 26-29 are provided on only first side 252, and thereby this facilitates evenly pressing the plurality of connection terminals 26-29 into contact.

The width of first joining part 262 of first connection terminal 26 is smaller than the width of first press-contact part 261. Therefore, first connection terminal 26 may be bent with little force compared to the case where the width of first joining part 262 and the width of first press-contact part 261 are the same. In the same manner, second to fourth connection terminals 27-29 may be bent with little force. Thus, it is possible to reduce the amount of force applied to seal part 25 of sensor circuit assembly 2 when bending first to fourth connection terminals 26-29. This prevents seal part 25 from breaking during the bending process. Additionally, first to fourth connection terminals 26-29 may be bent with a small amount of force, and therefore it is possible to improve the precision of the bending angle for first to fourth connection terminals 26-29.

First pressure part 260 protrudes outside of first terminal housing 316. This therefore facilitates pressing first pressure part 260 when pressing first connection terminal 26 into contact. This further facilitates pressing first connection terminal 26 into contact with wire 61. Second to fourth connection terminals 27-29 provide the same effects as first connection terminal 26.

Width w3 of slit 267 in first connection terminal 26 is smaller than width w7 of a bundle of a plurality of cores 612 that are not in press contact. In this case, the bundle of cores 612 are sandwiched by slit 267 in first connection terminal 26 to firmly connect cores 612 and first connection terminal 26. Second to fourth connection terminals 27-29 provide the same effects as first connection terminal 26.

The inner surface of borehole 35 in holder 3 includes first to fourth protrusions 354-357. Accordingly, first to fourth protrusions 354-357 establish a uniform gap between the inner surface of borehole 35 and the outer surface of cable 6. Therefore, a uniform amount of adhesive may be poured in between borehole 35 and cable 6 when bonding cable 6 to borehole 35. This improves the strength of the adhesive bonding of cable 6.

The inner diameter of second bore section 352 is larger than the inner diameter of first bore section 351 in borehole 35 in holder 3. Additionally the inner diameter of second bore section 352 is larger towards the end section of borehole 35.

Therefore, this facilitates pouring an adhesive between borehole 35 and cable 6. This reduces the occurrence of defective bonding.

The positioning section 36 in holder 3 is arranged to overlap with one portion of borehole 35 at the upper portion of borehole 35. Therefore, this facilitates positioning of the upper end section of outer coating 60 of cable 6. Additionally, the positioning section 36 is portion of first wall 31. Accordingly, first wall 31 may also serve as positioning section 36.

The area of light-receiver lens part 222 differs from the area of light-emitter lens part 212. Therefore, the area of light-emitter lens part 212 and the area of light-receiver lens part 222 may be a size that is appropriate for light emitting element 211 and light receiving element 221 respectively. Additionally, light emitting element 211 and light receiving element 221 are integrally installed on lead frame 24, and therefore light-emitter lens part 212 and light-receiver lens part 222 may be cast at the same time when manufacturing sensor circuit assembly 2. Therefore, even if the area of light-emitter lens part 212 and the area of light-receiver lens part 222 are different, it is possible to cast light-emitter lens part 212 and light-receiver lens part 222 with a shared mold without having to use individual molds. Hereby, the number of manufacturing man-hours and the cost decrease.

While cable 6 is installed in holder 3 by moving cable 6 upward towards holder 3, sensor circuit assembly 2 is installed on holder 3 by moving sensor circuit assembly 2 downward toward holder 3. Additionally, sub case 4 and main case 5 are moved downward toward holder 3 to be mounted on holder 3. Accordingly, after installing cable 6 in holder 3, sensor circuit assembly 2, sub case 4, and main case 5 may be assembled onto holder 3 in order in the same direction. This facilitates the assembling of photosensor 1.

Main case 5 includes detection depth marks 533, 543. Detection depth marks 533, 543 indicate the detection depth for light emitting element 211 and light receiving element 221 in detection groove 55. Accordingly, an operator may use detection depth marks 533, 543 to easily determine the detection depth. Additionally, detection depth marks 533, 543 made up of recesses, and therefore detection depth marks 533, 543 may also function to prevent photosensor 1 from slipping.

The claims are not limited to the above-mentioned embodiments, and may be modified in various ways insofar as the modifications do not depart from the spirit and scope of the invention.

The present invention is not limited to a transmissive photosensor, and may be applied to a reflective photosensor.

Figure 23:
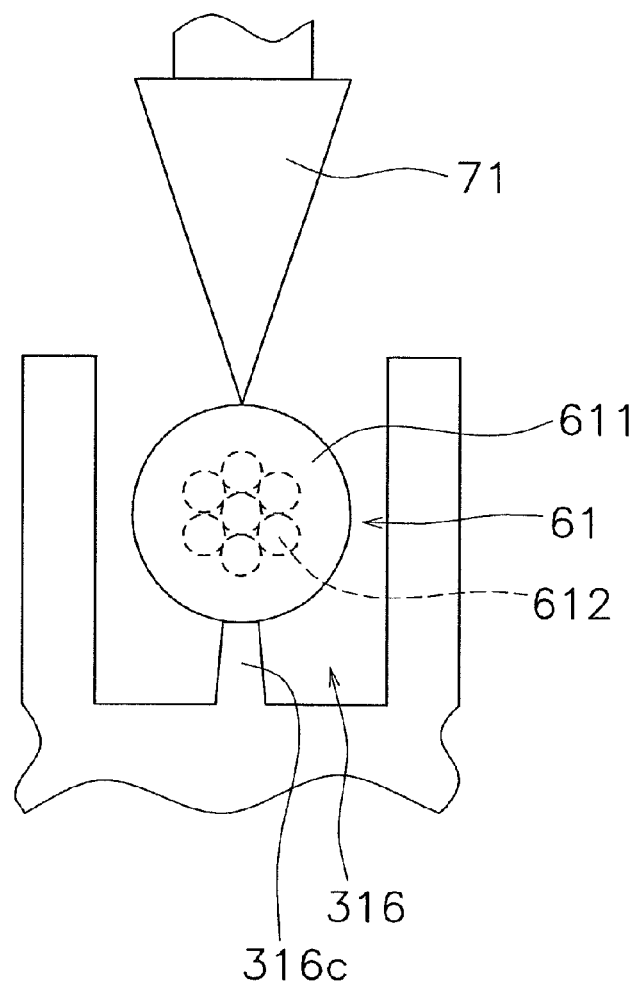
FIG. 23 illustrates a connection terminal in accordance with another embodiment.

The shape of the connection terminals is not limited to the shape of the connection terminals in the above-mentioned embodiment. For example, the connection terminals may be pointed similarly to connection terminal 71 illustrated in FIG. 23. Connection terminal 71 pierces wire 61 to connect with wire 61. In this case, connection terminal 71 pierces wire 61 and comes into contact with core 612 to thereby electrically connect connection terminal 71 and wire 61. Alternatively, connection terminal may be arranged to pass through the seal part. In this case, pressing the end part of the connection terminal from above the seal part thereby presses the connection terminal into contact with the wire.

The material used for light-emitter lens part 212, light-receiver lens part 222, and seal part 25 is not limited to the above described material. For example, light-emitter lens part 212, light-receiver lens part 222, and seal part 25 may be formed from a material other than resin. Additionally, light-emitter lens part 212, light-receiver lens part 222, and seal part 25 may be made from different materials. However, to integrally cast light-emitter lens part 212, light-receiver lens part 222, and seal part 25, it is preferable for light-emitter lens part 212, light-receiver lens part 222, and seal part 25 to be formed of the same material. Seal part 25 is not limited to sealing only one portion of lead frame 24, and may seal the entire lead frame 24.

Figure 24A:
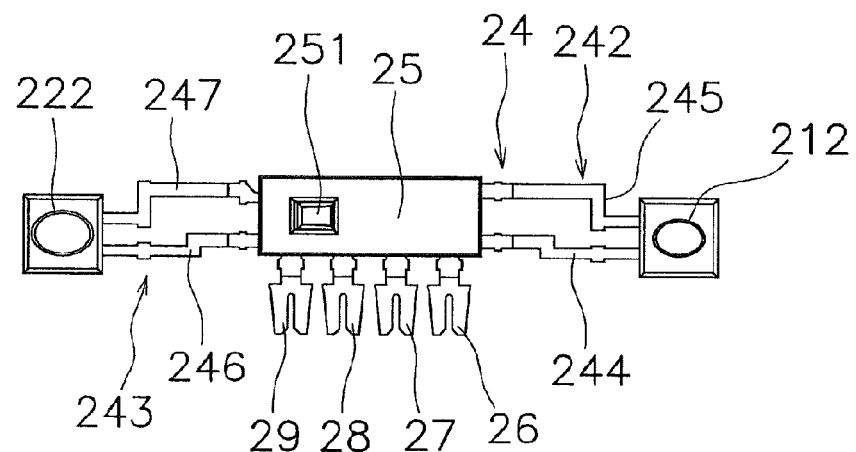
FIGS. 24A and 24B illustrate a light-emitter lens part and a light-receiver lens part in accordance with another embodiment.
Figure 24B:
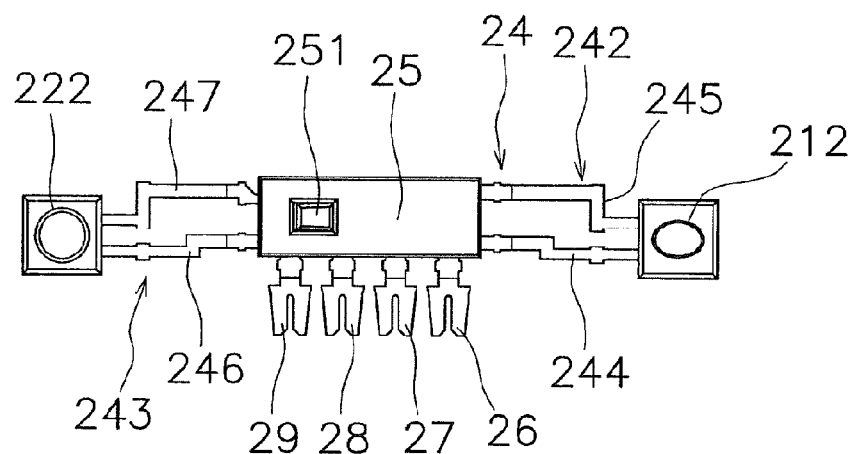

Light-emitter lens part 212 and light-receiver lens part 222 are not limited to the shape of a circle. For example, as illustrated in FIG. 24A, light-emitter lens part 212 and light-receiver lens part 222 may be the shape of an ellipse. Alternatively, as illustrated in FIG. 24B, one of light-emitter lens part 212 and light-receiver lens part 222 may be a circle, while the other is an ellipse. Moreover, in FIG. 24B light-emitter lens part 212 is an ellipse and light-receiver lens part 222 is a circle; however light-emitter lens part 212 may be a circle, while light-receiver lens part 222 is an ellipse.

Light-emitter leads 242 and light-receiver leads 243 may have mutually asymmetrical shapes. First light-emitter lead 244 and second light-emitter lead 245 may have the same or symmetrical shapes. First light-receiver lead 246 and second light-receiver lead 247 may have the same or symmetrical shapes.

The number of connection terminals is not limited to four. Sensor circuit assembly 2 may have less than four, or more than four connection terminals. Sensor circuit assembly 2 may have less than four, or more than four wire housings to match the number of connection terminals. Additionally sensor circuit assembly 2 may have less than four, or more than four terminal housings to match the number of connection terminals. The number of protrusions on the inner surface of borehole 35 is not limited to four, and may be no less than three. Furthermore, operation indicator 231 may be omitted from sensor circuit assembly 2.

The arrangement of the plurality of connection terminals is not limited to the above-mentioned arrangements in the embodiment. For example, the plurality of connection terminals may be provided on both first side 252 and second side 253 of seal part 25. However, if the plurality of connection terminals is provided on both first side 252 and second side 253 of seal part 25, it will be necessary to provide a uniform force to press down on the connection terminals on first side 252, and the connection terminals on second side 253 during press contact. Accordingly, in an effort to simplify production of the photosensor, the plurality of connection terminals may be preferably provided on only one side of either first side 252 or second side 253 of seal part 25.

Additionally, in the above-mentioned embodiment the shape of seal part 25 is a square in a plan view, in other words when viewed from above, however the seal part may have another shape. For example, the seal part may be a triangle in a plan view. Even in this case, providing the connection terminals on only one of a pair of mutually opposite sides thereby allows the connection terminals to be pressed with an even amount of force in the same manner as in the above-mentioned embodiment.

The width of the slit in the connection terminal may be smaller than the diameter of the core. In this case, when the core is deformed and pushed into the slit, the core and the connection terminal are firmly connected.

In the above-mentioned embodiment, the excess wire is cut after first to fourth connection terminals 26-29 are pressed into contact with wires 61-64. However, the excess wire may be cut before first to fourth connection terminals 26-29 are pressed into contact with wires 61-64.

Detection depth marks 533, 543 are not limited to being recessed from the surface of main case 5, and may be projections protruding from the surface of main case 5. Alternatively, detection depth marks 533, 543 may have some kind of surface roughness that is rougher than the other segments of main case 5.

Element position marks 532, 542 are not limited to the above described triangles, but may be another shape. Detection depth marks 533, 543 are not limited to the above described bars, but may be another shape. For example, as illustrated in FIGS. 25A-25H, main case 5 may be given a pattern or a color different from other segments, where the boundary of the pattern or color represent detection depth marks 533, 543.

In FIG. 25A, patterns A1, A2 constituted by a plurality of straight lines are added to main case 5. Each straight-line extends vertically, and is arranged horizontally side by side. The lower boundaries of patterns A1, A2, in other words the lower end sections of each of the straight lines correspond to detection depth marks 533, 543. In FIG. 25B, patterns B1, B2 constituted by a plurality of straight lines are added to main case 5. Each straight-line extends vertically, and is arranged horizontally side by side. The upper boundaries of patterns B1, B2, in other words the lower end sections of each of the straight lines correspond to detection depth marks 533, 543. Additionally, patterns A1, A2, B1, B2 may be constituted by recesses and projections. Alternatively, patterns A1, A2, B1, B2 may have a rougher surface roughness than the other segments of main case 5.

In FIG. 25C, patterns C1, C2 constituted by a plurality of straight lines are added to main case 5. Each straight-line extends horizontally, and are arranged vertically in a row. The lower boundaries of patterns C1, C2, in other words the straight line at the lowest position corresponds to detection depth marks 533, 543. In FIG. 25D, patterns D1, D2 constituted by a plurality of straight lines are added to main case 5. Each straight-line extends horizontally, and are arranged vertically in a row. The upper boundaries of patterns D1, D2, in other words the straight line at the highest position, correspond to detection depth marks 533, 543. Additionally, patterns C1, C2, D1, D2 may be constituted by recesses and projections. Alternatively, patterns C1, C2, D1, D2 may have a coarser surface roughness than the other segments of main case 5.

In FIG. 25E, meshed patterns E1, E2 are added to main case 5. The lower boundaries of patterns E1, E2 correspond to detection depth marks 533, 543. In FIG. 25F, meshed patterns F1, F2 are added to main case 5. The upper boundaries of patterns F1, F2 correspond to detection depth marks 533, 543. Additionally, patterns E1, E2, F1, F2 may be constituted by recesses and projections. Alternatively, patterns E1, E2, F1, F2 may have a coarser surface roughness than the other segments of main case 5.

In FIG. 25G, one portion of main case 5 has a different color from the other segments of the case. The lower boundaries of different-colored segments G1, G2, correspond to detection depth marks 533, 543. In FIG. 25H, one portion of main case 5 has a different color from the other segments of the case. The upper boundaries of different-colored segments H1, H2, correspond to detection depth marks 533, 543. Additionally segments G1, G2, H1, H2 may be constituted by recesses and projections. Alternatively, segments G1, G2, H1, H2 may have a coarser surface roughness than the other segments of main case 5.

As long as the light-emitter support supports the light emitting element, the shape and structure thereof is not limited to the above described embodiment. For example, the light-emitter support may be a lead as in the above-mentioned embodiment, or maybe another structure configuration such as a pattern formed over a resin material. The light-emitter support is not limited to extending in the vertical direction as in the above-mentioned embodiment, and may extend in another direction. For example, the light-emitter support may extend in a direction inclined in relation to the vertical direction. The light-emitter support is not limited to being linear, and may be another shape. For example, the light-emitter support may be curved. As long as the light-receiver support supports the light receiving element, the shape and structure thereof is not limited to the above described embodiment. For example, the light-receiver support may be a lead as in the above-mentioned embodiment, or maybe another structure configuration such as a pattern formed over a resin material. The light-receiver support is not limited to extending in the vertical direction as in the above-mentioned embodiment, and may extend in another direction. For example, the light-receiver support may extend in a direction inclined in relation to the vertical direction. The light-receiver support is not limited to being linear, and may be another shape. For example, the light-receiver support may be curved.

What is claimed is:

1. A photosensor comprising: a sensor circuit assembly including: a light emitter and a light receiver that face each other;
   a first support that extends from the light emitter and supports the light emitter;
   a second support that extends from the light receiver and supports the light receiver; and
   a connector that connects one end of the first support and one end of the second support;
   the connector comprising a seal and a first terminal that protrudes from the seal;
   wherein the first terminal comprises a first press-contact portion provided on a lower portion of the first terminal furthest away from the seal, and the first terminal further comprises an upper portion closest to the seal, wherein the first press-contact portion provides press contact with another component to be connected to the sensor circuit assembly in a downward direction with respect to the sensor circuit assembly,
   wherein the upper portion of the first terminal protrudes outwards from the seal on one side of the sensor circuit assembly,
   wherein the first terminal further comprises a joint; and the joint joins the first press-contact portion and the seal; the width of the joint is smaller than the width of the first press-contact portion; and
   the first terminal curves at the joint.

2. The photosensor according to claim 1, wherein the upper portion of the first terminal is one portion of an edge face of the first terminal.

3. The photosensor according to claim 1, further comprising: a first wire that connects to the sensor circuit assembly; and
   the first press-contact portion of the first terminal contacts the first wire along the downward direction.

4. The photosensor according to claim 3, further comprising: a holder that supports the first wire; and
   the holder includes:
      a first wire housing that envelopes the first wire; and
      a first terminal housing that envelopes the first terminal; wherein
      the first wire is pressed into contact with the first terminal within the first wire housing.

5. The photosensor according to claim 4, wherein the first press-contact part of the first terminal includes a slit,
   the first terminal housing includes a protrusion, the protrusion protrudes from a bottom of the first terminal housing toward the slit, and the bottom of the first terminal housing faces a tip end of the first terminal when first terminal housing houses the first terminal.

6. The photosensor according to claim 4, wherein the holder further includes a catch that locks onto the sensor circuit assembly; and the catch locks onto the sensor circuit assembly when the first terminal is pressed into contact with the first wire.

7. The photosensor according to claim 3, further comprising: a second wire configured to connect to the sensor circuit assembly;

the connector further includes a second terminal that protrudes from the seal; and the second terminal is pressed into contact with the second wire in the press-contact direction.

8. The photosensor according to claim 7, wherein the second terminal further comprises a second press-contact portion provided furthest from the seal, and an upper portion provided closest to the seal.

9. The photosensor according to claim 7, wherein the seal includes a first side and a second side;

the first and second sides are positioned opposite to each other;

the first terminal and the second terminal are on the first side; and the second side lacks a connection terminal.

10. The photosensor according to claim 7, further comprising:

a holder that supports the first wire and the second wire, the holder comprises:

a first wire housing that envelopes the first wire;

a second wire housing that envelopes the second wire;

a first terminal housing that envelopes the first terminal; and a second terminal housing that envelopes the second terminal; wherein the first wire housing and the second wire housing are mutually partitioned;

the first wire press contacts the first terminal within the first wire housing; and the second wire press contacts the second connection terminal within the second wire housing.

11. The photosensor according to claim 7, further comprising: a cable including the first wire and the second wire;

a holder that supports the sensor circuit assembly and the cable;

and a main case that includes an internal space with an opening that houses the sensor circuit assembly and the holder; wherein the holder comprises a borehole in a downward press-contact direction; and the cable passes through the borehole; and the holder includes:

a first wire housing that envelopes the first wire;

a second wire housing that envelopes the second wire;

a first terminal housing that houses the first connection terminal; and a second terminal housing that houses the second connection terminal; wherein the first wire housing and the second wire housing extend in a direction that intersects the downward press-contact direction and that open upward; and the first terminal housing intersects the first wire housing and opens upward; and the second terminal housing intersects the second wire housing, and opens upward; and a tip end of the first connection terminal and a tip end of the second connection terminal face downward; and the first connection terminal press contacts the first wire within the first wire housing; and the second connection terminal press contacts the second wire within the second wire housing.

12. The photosensor according to claim 1, wherein the sensor circuit assembly includes a light-emitter lens that covers the light emitter, and a light-receiver lens that covers the light receiver; and the light-receiver lens and the light-emitter lens have different shapes.

13. The photosensor according to claim 1, further comprising: a holder that supports the sensor circuit assembly;

and a main case that houses the sensor circuit assembly and the holder; wherein the main case includes:

a light-emitter case that houses the light emitter;

a light-receiver case that houses the light receiver; and a detection groove located between the light-emitter case and the light-receiver case; and the main case includes a mark; wherein the mark indicates detection depth required for an object to be detected in the detection groove.

14. A photosensor comprising: a sensor circuit assembly including: a light emitter and a light receiver that face each other;

a first support that extends from the light emitter and supports the light emitter;

a second support that extends from the light receiver and supports the light receiver; and a connector that connects one end of the first support and one end of the second support;

the connector comprising a seal and a first terminal that protrudes from the seal;

wherein the first terminal comprises a first press-contact portion provided on a lower portion of the first terminal furthest away from the seal, and the first terminal further comprises an upper portion closest to the seal, wherein the first press-contact portion provides press contact with another component to be connected to the sensor circuit assembly in a downward direction with respect to the sensor circuit assembly, the photosensor further comprising:

a first wire that connects to the sensor circuit assembly;

the first press-contact portion of the first terminal contacts the first wire along the downward direction;

a second wire configured to connect to the sensor circuit assembly;

the connector further includes a second terminal that protrudes from the seal; and the second terminal is pressed into contact with the second wire in the press-contact direction, a cable including the first wire, the second wire, and an outer coating that covers the first wire and the second wire; and a holder that supports the cable; wherein the holder includes a borehole that passes therethrough;

an inner surface of the borehole has at least three protrusions;

the cable passes through the borehole; and an adhesive fills space between the inner surface of the borehole and the cable.

15. The photosensor according to claim 14, wherein the borehole includes a first bore section and a second bore section;
- the first bore section and the second bore section are side by side in the axial direction of the borehole;
- the second bore section includes an end section of the borehole; and
- the inner diameter of the second bore section is larger than the inner diameter of the first bore section.

16. The photosensor according to claim 14, wherein the holder includes a positioning section; and
- the positioning section overlaps a portion of the borehole in the direction wherein the borehole passes through the holder.

17. The photosensor according to claim 16, wherein the holder includes a wall that overlaps a portion of the borehole;
- the wall includes a first wire housing that envelopes the first wire; and a second wire housing that envelopes the second wire; and
- the positioning section is one portion of the wall.

18. A photosensor comprising: a sensor circuit assembly including: a light emitter and a light receiver that face each other;
- a first support that extends from the light emitter and supports the light emitter;
- a second support that extends from the light receiver and supports the light receiver; and
- a connector that connects one end of the first support and one end of the second support;
- the connector comprising a seal and a first terminal that protrudes from the seal;
- wherein the first terminal comprises a first press-contact portion provided on a lower portion of the first terminal furthest away from the seal, and the first terminal further comprises an upper portion closest to the seal, wherein the first press-contact portion provides press contact with another component to be connected to the sensor circuit assembly in a downward direction with respect to the sensor circuit assembly, the photosensor further comprising:
- a first wire that connects to the sensor circuit assembly;
- the first press-contact portion of the first terminal contacts the first wire along the downward direction;
- a cable including the first wire;
- a holder that supports the sensor circuit assembly and the cable; and
- a main case having an internal space with an opening that encloses the sensor circuit assembly and the holder; wherein
- the holder includes a borehole in a downward press-contact direction;
- the cable passes through the borehole; and
- the holder includes a first wire housing that envelopes the first wire; and
- a first terminal housing that envelopes the first terminal; wherein
- the first wire housing has a long axis extending in a direction that intersects the downward press-contact direction and that opens upward;
- the first terminal housing intersects the first wire housing and opens upward;
- the sensor circuit assembly is mounted on the top of the holder; and
- a tip end of the first terminal faces downward;
- the first press-contact portion of the first terminal pierces the first wire from above in the first wire housing and thereby pressure contacts the first wire;
- the internal space opening in the main case faces down; and
- the main case is mounted onto the top of the holder.

* * * * *